US006754613B2

(12) United States Patent
Tabatabaei et al.

(10) Patent No.: US 6,754,613 B2
(45) Date of Patent: Jun. 22, 2004

(54) HIGH RESOLUTION TIME-TO-DIGITAL CONVERTER

(75) Inventors: Sassan Tabatabaei, Burnaby (CA); Andre Ivanov, Richmond (CA)

(73) Assignee: Vector 12 Corporation, Richmond (CA)

( * ) Notice: Subject to any disclaimer, the term of this patent is extended or adjusted under 35 U.S.C. 154(b) by 85 days.

(21) Appl. No.: 10/244,085

(22) Filed: Sep. 16, 2002

(65) Prior Publication Data

US 2003/0098731 A1 May 29, 2003

Related U.S. Application Data

(63) Continuation-in-part of application No. PCT/CA01/00364, filed on Mar. 16, 2001.
(60) Provisional application No. 60/189,975, filed on Mar. 17, 2000.

(51) Int. Cl.[7] .................................................. H03L 7/00

(52) U.S. Cl. ...................................................... 702/189

(58) Field of Search ......................... 702/189; 327/160; 331/57; 377/25, 52, 2; 369/45; 370/464; 324/142; 362/187; 455/9; 368/29; 709/207

(56) References Cited

U.S. PATENT DOCUMENTS

| | | | | |
|---|---|---|---|---|
| 3,325,750 A | | 6/1967 | O'Hern et al. | |
| 3,505,594 A | | 4/1970 | Tarczy-Hornoch et al. | |
| 3,710,334 A | * | 1/1973 | Pace | 342/397 |
| 4,164,648 A | | 8/1979 | Chu | |
| 4,165,459 A | | 8/1979 | Curtice | |
| 5,638,418 A | * | 6/1997 | Douglass et al. | 377/25 |
| 5,663,991 A | | 9/1997 | Kelkar et al. | |
| 5,835,501 A | | 11/1998 | Dalmia et al. | |
| 5,889,435 A | | 3/1999 | Smith et al. | |
| 6,295,315 B1 | | 9/2001 | Frisch et al. | |

FOREIGN PATENT DOCUMENTS

| | | |
|---|---|---|
| GB | 1251967 | 11/1971 |

OTHER PUBLICATIONS

R.J.A. Harvey et al. "Test Evaluation for Complex Mixed–Signal IC's by Introducing Layout Dependent Faults", *IEE Colloquium on Mixed Signal VLSI Test* pp. Jun. 1–8, 1993.

Dalmia et al. "Power Supply Current Monitoring Techniques for Testing PLLs", *Proc. of Asian Test Symposium*, pp. 366–371, 1997.

Devarayanadurg et al. "Hierachy Based Statistical Fault Simulation of Mixed–Signal ICs", *Int. Test Conf.*, pp. 521–527, 1996.

Goteti et al. "DFT for Embedded Charge–Pump PLL Systems Incorporating IEEE 1149.1", *Proceedings from Custom Integrated Circuits Conference*, 1997, pp. 210–213.

Azias et al. "A Unified Digital Test Technique for PLL's Using Re–configurable VCO", *Proceedings of International Mixed–Signal Test Workshop*, 1999.

Sunter et al. "BIST for Phase–Locked Loops in Digital Applications", *Proceedings from International Test Conference*, 1999, pp. 532–540.

(List continued on next page.)

*Primary Examiner*—John Barlow
*Assistant Examiner*—Tung Lau
(74) *Attorney, Agent, or Firm*—Oyen Wiggs Green & Mutala

(57) ABSTRACT

A time to digital converter (TDC) has a pair of digital oscillators. The periods of the oscillators differ by $T_\Delta$. The oscillators are triggered by START and STOP pulses. A counter counts a number of pulses until reference points on the signals output by the oscillators coincide. Measurements may be made using a dual resolution method. Intrinsic jitter of the TDC can be determined by comparing sets of measurements in which the switch in resolutions is made at different points. A range extender circuit may be provided to extend a valid measurement range of the TDC.

115 Claims, 25 Drawing Sheets

OTHER PUBLICATIONS

Veillette et al. "On–chip Measurement of the Jitter Transfer Function of Charge–Pump Phase–Locked Loops", *Proceedings of International Test Conference*, 1997, pp. 776–785.

Veillette et al. "Stimulus Generation for Built–In Self–Test of Charge–Pump Phase–Locked Loops", *Proceedings from International Test Conference*, 1998, pp. 698–707.

Santos, "A CMOS Delay Locked and Sub–Nanosecond Time–to Digital Converter Chip", *IEEE Transactions On Nuclear Science*, vol. 43, pp. 1717–1719, Jun. 1996.

Arai, "A Time Digitizer CMOS Gate Array with a 250 ps Time Resolution", *IEEE Journal of Solid–State Circuits*, v. 31, pp. 212–220, Feb., 1996.

Christiansen, "An Integrated High Resoution CMOS Timing Generator Based on an Array of Delay Locked Loops", *IEEE Journal of Solid–State Circuits*, v. 31, pp. 952–957, Feb. 1999.

Mota et al. "A High Resolution Time Interpolator Based on a Delay Locked Loop and an RC Delay Line", *IEEE Journal of Solid–State Circuits*, vol. 34, pp. 1360–1366.

Kalisz et al. "Field Programmable Gate Array Based Time to Digital Converter with 200 ps Resolution", *IEEE Trans. on Instrumentation and Measurement*, v. 46, pp. 51–55, Feb., 1997.

Porat, "Review of Sub–nanosecond Time–interval Measurement", *IEEE Transaction on Nuclear Science*, May 1973, vol. NS–20, No. 5, pp. 36–51.

Millman et al. "Pulse and Digital Circuits", McGraw–Hill Book Company, 1956, pp. 508–514.

Chan et al. "A Synthesizable, Fast and High–Resolution Timing Measurement Device Using a Component–Invariant Vernier Delay Line", *International Test Conference*, Oct. 2001, pp. 858–867.

* cited by examiner

HIGH RESOLUTION TIME-TO-DIGITAL CONVERTER

CROSS-REFERENCE TO RELATED APPLICATION

This application claims the benefit of the filing date of U.S. application Ser. No. 60/189,975 filed on 17 Mar., 2000, which is hereby incorporated by reference in its entirety. This is a continuation-in-part of P.C.T. application No. PCT/CA01/00364 filed on 16 Mar. 2001 entitled HIGH RESOLUTION TIME-TO-DIGITAL CONVERTER which designates the United States and is hereby incorporated by reference.

TECHNICAL FIELD

This invention relates to time-to-digital conversion ("TDC"), more specifically to time to digital conversion methods and apparatus which use a differential period between frequency-mismatched oscillators to measure time between events to high resolution. The invention has particular application in measuring jitter characteristics in high frequency digital signals. Specific embodiments of the invention are useful for on-board or on-chip self testing of timing circuits such as phase-locked loops ("PLLs"), delay-locked loops ("DLLs"), and serialiser/deserializers. Another aspect of the invention relates to a finely tunable digital ring oscillator suitable for use in TDC systems according to the invention.

BACKGROUND OF THE INVENTION

The timing of signals in high speed digital systems can be important to the proper operation of such systems. There is a need for ways to measure time characteristics of digital signals. Jitter is an example of such a time characteristic. Jitter is an important characteristic of high-speed digital signals generally. While there exist sophisticated stand-alone devices capable of measuring jitter in high-speed digital signals, such devices tend to be extremely complicated and expensive. Jitter testing typically requires a long test time. Further, where the signal to be tested is internal to an integrated circuit, it may not be practical to use a stand-alone device to test for jitter.

Timing circuits such as phase-locked loops, delay-locked loops, and serializers/deserializers are used widely in many high-speed integrated circuits. These circuits are used in many applications. Some examples are synthesizing clock signals, recovering data, realigning clock edges and timing the transmission of data.

Jitter in the outputs of such timing circuits can is cause malfunctions. These malfunctions can be very difficult to diagnose. As complex-System on Chip ("SOC") integrated circuits become even more complicated and clock speeds increase into the gigahertz range, it becomes increasingly costly and time consuming to test such circuits.

The definition of jitter varies depending on the field of application. In sequential circuits, e.g. CPUs, jitter is defined as the variation of the clock period, known as "cycle-to-cycle" or "period jitter". As shown in FIG. 1A, period jitter samples are collected by measuring the duration of each period of the signal IN1.

For both period and accumulative jitter measurements, M jitter samples are collected to calculate jitter characteristics, such as rms, peak-to-peak, or frequency components. For example, the rms jitter may be obtained by performing the following computations:

$$T_{J(\mathrm{rms})} = \sqrt{\frac{1}{M}\sum_{i=0}^{M-1}(T_J(i)-\overline{T})^2} \qquad (1)$$

where $$\overline{T} = \frac{1}{M}\sum_{i=0}^{M-1} T_J(i)$$

is the estimate of average signal period.

Some jitter specifications for PLLs used in digital communication interfaces are intrinsic jitter, jitter tolerance and jitter transfer. These specifications are given in standards for each application (e.g., see Bell Research Laboratories SONET transport systems: *Common criteria network element architectural features* GR-253 core, Issue 1, pp. 5–81, December, 1994 for SONET interfaces).

In serial communication applications, jitter can be defined as the short-term variations of a digital signal's significant instants, e.g. rising edges, from their ideal position in time. Such jitter is often denoted as "accumulative jitter" and is described as a phase modulation of a clock signal. In a clock synthesis circuit, where the absolute jitter is important, often a jitter-free (practically low-jitter) reference signal is used for jitter measurement. In such a case, the difference between the position of corresponding edges of the signal (IN1) relative to the reference clock (REF) indicates the jitter. FIG. 1B illustrates how accumulative jitter samples, $T_{J(I)}$ for I=1, . . . , N can be collected using a TDC.

Sometimes, the relative jitter between two signals is of interest if neither of the two signals is a jitter-free signal, e.g. in data recovery circuits. FIG. 1C shows how relative jitter between the edges of signal IN1 and IN2 can be measured using a TDC.

Intrinsic jitter is defined as the jitter at the output of the PLL when the input is jitter-free. This is often expressed in terms of unit interval UI, which is defined as the period of a signal with a frequency equal to the average frequency of the original signal. For example in a 155.54 MHz SONET network application, 1 UI is 6.429 ns.

Functional testing is typically used to test today's high-speed timing circuits. Functional testing, however, does not guarantee correct operation over all operational conditions. Structural test methods are proposed as test solutions, but most of them are too intrusive (i.e. the testing itself has a significant effect on the performance of the circuit) or provide poor correlation to important specifications such as jitter. Jitter specifications are typically the single most important set of specifications for a high-speed timing circuit. Jitter specifications include intrinsic jitter, jitter transfer functions and jitter tolerance. Testing such a circuit to determine whether its actual jitter characteristics meet its specifications is a significant problem.

There is a need for systems capable of measuring jitter characteristics of high-speed digital signals. There is a particular need for such systems capable of measuring jitter in timing circuits internal to complicated integrated circuits.

Various authors have proposed methods for testing devices such as PLLs. All of these proposed methods have disadvantages. R. J. A. Harvey et al. *Test evaluation for complex mixed-signal IC's by introducing layout dependent faults*, IEEE Colloquium on Mixed Signal VLSI Test, pp. 6/1–8, 1993 suggests testing PLLs by performing partial specification testing by measuring lock range, lock time and power supply current. Dalmia et al. *Power supply current monitoring techniques for testing PLLs* Proc. of Asian Test Symposium, pp. 366–371, 1997 and Dalmia et al., U.S. Pat. No. 5,835,501 disclose the use of power supply current monitoring for PLL testing.

Devarayanadurg et al. *Hierarchy based statistical fault simulation of mixed signal IC's* Int. Test Conf. pp. 521–527, 1996 and Goteti et al. *DFT for embedded charge-pump PLL systems incorporating IEEE* 1149.1, Proc. of Custom Integrated Circuits Conf. pp. 210–213, 1997 propose methods for efficient fault simulation of PLLs and suggest lock frequency range measurement for PLL testing.

Although a combination of these techniques may provide an effective test result, it is difficult to correlate the test results to important jitter specifications. This is partly because simulating jitter for fault-free and faulty circuits is extremely difficult due to a lack of tools capable of simulating noise in non-linear dynamic circuits.

Azias et al. *A unified digital test technique for PLLs using reconfigurable VCO* Proc. of Int. Mixed Signal Test Workshop, 1999 discloses a reconfiguration technique for testing ring oscillator-based PLLS. This technique has the advantage of being compatible with digital test methods, but it requires reconfiguring sensitive parts of a PLL. Also, it exhibits the problem of unknown correlation of test results and functional specifications.

S. Sunter et al. *BIST for phase-locked loops in digital applications*, Proc. of Int. Test Conf. pp. 532–540, 1999 discloses a BIST circuit capable of measuring lock range and loop gain of a PLL in addition to performing a jitter test. Methods which use this circuit to measure jitter depend on bit error rate (BER) and so can only provide statistical information about jitter. Such methods may give pessimistic estimates of jitter in noisy digital environments. This might lead to discarding some good devices.

U.S. Pat. Nos. 5,663,991 and 5,889,435 disclose on-chip jitter measurement techniques for testing PLL circuits. The BIST circuits proposed in these patents are mixed-signal and their resolution is limited to one gate delay. This is inadequate for testing high-speed PLLs.

Veillette et al. *On-chip measurement of the jitter transfer function of charge-pump phase locked loops*, Int. Test Conf. pp. 776–785, 1997 disclose a jitter transfer function measurement circuit. This circuit does not have sufficient resolution for intrinsic jitter testing.

Veillette et al., *Stimulus generation for built in self test of charge pumped phase locked loops*, Int. Test Conf. pp. 698–707, 1998 proposes a method for generating jitter at the input of a PLL for jitter transfer testing. This method, however, requires reconfiguration of the feedback in the PLL loop, which could affect the performance of the loop.

Another on-chip jitter test method is to determine jitter by measuring time intervals between the significant edges of one or two signals. Such measurement can be done with a time-to-digital converter (TDC). A TDC produces a digital output representing the time elapsed between two temporally separated events. FIGS. 1A, 1B and 1C illustrate respectively how period, accumulative jitter, and relative jitter can be measured through the use of a TDC 10.

Various TDC circuits have been used in physics experiments. It has been suggested that such TDC circuits could be used in jitter measurement. Existing TDC circuits occupy large areas, do not provide high resolution, and rely heavily on matching of the elements.

Kelkar et al. U.S. Pat. No. 5,663,991 disclose the use of a controlled delay line in an on-chip jitter measurement method. This circuit suffers from the same limitations as most TDCs.

A classic method of measuring a time interval is to start a counter at the beginning of the interval and stop it when the interval ends. The resulting number in the counter will be proportional to the time interval. The resolution in this method is the period of the clock controlling the counter. To measure intrinsic jitter of a high-speed PLL (e.g. a 155 MHz clock synthesis PLL), where a high resolution in the range of 20 ps is required, a clock frequency of 50 GHZ would be needed. This method is not suitable for on-chip applications where the maximum clock available is in the range of a few hundreds of MHz.

Santos, *A CMOS delay locked and sub-nanosecond time-to-digital converter chip*, IEEE Trans on Nuclear Science, vol. 43, pp. 1717–1719, June, 1996 discloses a TDC based on the use of a delay chain. In this circuit, the output of the delay elements in the delay chain are set HIGH as the START rising edge travels through them. A delay locked loop (DLL) is used to calibrate the delay elements to a known delay. Such a calibration requires very good matching between all the delay elements in both the delay chain and the DLL.

Arai, *A time digitizer CMOS gate array with a* 250 *ps time resolution*, IEEE Journal of Solid-State Circuits, v. 31, pp. 212–220, February, 1996 discloses an alternative TDC in which an analog delay chain and DLL are combined. This obviates the need for element matching. In both of the schemes of Santos and Arai the DLL and the controlled delay elements are analog.

A fully digital TDC could be made by eliminating the DLL and using digital gates as delay elements. The trade-off is decreased accuracy due to the quantization error associated with calibration reference inputs. The resolution $T_\Delta$ of such methods without time interpolation is limited to one gate delay at best. In typical 0.35 $\mu$m CMOS technology, the smallest gate delay is approximately 50 ps, whereas a resolution and precision of about 20 ps is required for functional testing of high-speed PLLs with 155 MHz center frequency. Also, since this delay is dependent on process variations and temperature, the resolution in such schemes is not controllable.

Christiansen, *An integrated high resolution CMOS timing generator based on an array of delay locked loops*, IEEE Journal of Solid-State Circuits, v. 31, pp. 952–957, February, 1996, proposes the use of an array of DLLs to improve the measurement resolution. Mota et al. *A high resolution time interpolator based on a delay locked loop and an RC delay line*, IEEE Journal of Solid-State Circuits, v. 34, pp. 1360–1366, October, 1999 propose the use of an RC delay line to increase the measurement resolution through time interpolation. Although resolutions in the range of 25 ps (rms) have been reported in these papers, the design of these circuits require a high degree of matching. Also, the design and layout of the DLL need to take into account the presence of significant power supply noise in large mixed-signal ICs.

Kalisz et al., *Field programmable gate array based time to digital converter with* 200 *ps resolution*, IEEE Trans. on Instrumentation and Measurement, v. 46, pp. 51–55, February, 1997 propose a Vernier delay technique based on using two delay chains. One chain is composed of gates (each with a delay of $\tau_g$). The other chain is made of latches (each with a delay of $\tau_l$). In this technique, the time quantization step is the difference between the delay of the delay elements in the two delay chains. A difficulty with this technique is that, since gates and latches are very different structures, $\tau_g$ and $\tau_l$ are likely to differ significantly. This makes it difficult to achieve high resolution (in the range of 20 ps or less).

All the schemes mentioned above require good matching of the elements in the delay chains to achieve good accuracy. This is difficult to achieve within an acceptable accuracy under typical process variations. As the time interval to be measured becomes longer, more elements must be added to the delay chains, making it even more difficult to assure matching of delays in the chains. When more elements are added, the elements must be placed further apart and more routing delay will have to be accounted for. Therefore, these schemes make it difficult to provide acceptable TDC linearity. In addition, these schemes do not lend themselves well to automatic place and route. Furthermore, the resolution is set by the process parameters on each chip and cannot be controlled or adjusted.

There is a need for a system capable of measuring directly the jitter characteristics of timing circuits on integrated circuit chips, including timing circuits such as PPLs. Such a system should ideally be:

compact (i.e. small in area compared to the circuit under test ("CUT"));

robust (i.e. resistant to process variations, temperature and power supply variations);

provide a digital output (i.e. the system should generate one or more digital signatures which can be sent off-chip at relatively low speed, e.g. serially);

accurate (measurement accuracy must be sufficient for the test);

capable of being calibrated (i.e. the system should be calibration-free, self-calibrating, or use readily available signals to the chip for calibration); and, have little or no impact on the performance of the CUT.

SUMMARY OF THE INVENTION

One aspect of this invention provides a time to digital converter (TDC). The TDC comprises a timing circuit which includes first and second digital oscillators. The oscillators produce first and second clock signals respectively. The first and second oscillators have different periods. The invention uses the accurately known average difference between the periods of the first and second oscillators to make high resolution time measurements. At least one of the oscillators has a variable period. In preferred embodiments of the invention, at least one of the oscillators comprises a plurality of digitally controllable delay elements. The delay elements, when activated alter the period of oscillation of the oscillator.

The TDC also includes a coincidence detector connected to generate a coincidence signal when a reference point in the first clock signal has a known time relationship to a corresponding reference point on the second clock signal. In preferred embodiments of the invention, the coincidence detector comprises a flip flop or other memory device which is set when an edge of the first clock signal coincides with a corresponding edge of is the second clock signal.

A first counter is connected to count a number of cycles of the first oscillator until the coincidence detector generates the coincidence signal. The number is related to the duration of an interval between starting the first oscillator and starting the second oscillator.

A resolution adjustment circuit is connected to start the first and second oscillators at times separated by a known interval, compare the number to a threshold and, if the number is not at least equal to a threshold value, alter the period of at least one of the oscillators by activating or deactivating one or more of the digitally controllable delay elements.

In a preferred, dual resolution, embodiment, the first and second oscillators are switchable between a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$; and the time to digital converter comprises a resolution switching control circuit connected to switch the timing circuit among its states, a second counter connected to count a number of edges of the first signal between a START signal and a time when the timing circuit is switched away from its first state, the first counter connected to count a number of edges of the first signal between the time when the timing circuit is switched into its second state and the time when coincidence signal is generated.

Another aspect of the invention provides a time to digital converter comprising a timing circuit comprising first and second digital oscillators producing first and second clock signals respectively. The first and second oscillators are switchable between a plurality of states including a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$. A resolution switching control circuit is connected to switch the timing circuit between its states when the reference point of the first clock signal approaches a predetermined time relationship with the reference point of the second clock signal. A coincidence detector connected to generate a coincidence signal when a reference point in the first clock signal has a known time relationship to a corresponding reference point on the second clock signal. A first counter is connected to count a number of edges of the first clock signal between the time when the timing circuit is switched from its first state to its second state and the time when the coincidence signal is generated and a second counter is connected to count a number of edges of the first signal between a START signal and a time when the timing circuit is switched from its first state to its second state.

In a preferred embodiment of the invention, the resolution switching control circuit comprises a delay element connected to provide a delayed first clock signal and a coincidence detector connected to generate a coincidence signal when a reference point in the second clock signal has a known time relationship to a corresponding reference point on the delayed first clock signal. Most preferably the delay element has a first state resulting in a first delay of the delayed first clock signal and a second state resulting in a second delay of the delayed first clock signal different from the first delay.

A further embodiment of the invention provides a digital timing circuit for generating first and second digital output signals having first and second periods. The timing circuit comprises a first ring oscillator triggered by a first control signal and generating a first clock signal; and a second ring oscillator triggered by a second control signal and generating a second control signal. At least one of the oscillators comprises a plurality of digitally controllable delay elements. The delay elements, when activated alter the period of the oscillator. The timing circuit comprises a coincidence detector connected to generate a coincidence signal when a reference point in the first clock signal has a known time relationship to a corresponding reference point on the second clock signal. A counter is connected to count a number, N, of cycles of the first oscillator between the first control signal and the coincidence signal. A resolution adjustment circuit connected to generate the first and second control signals at times separated by a known interval, compare the number N to a threshold and, if N is not at least equal to a threshold value altering the period of at least one of the oscillators by activating or deactivating one or more of the digitally controllable delay elements.

A still further aspect of the invention provides a method for producing first and second digital signals having first and second periods. The method comprises providing a pair of digital oscillators; starting the first oscillator and starting the second oscillator a time period Td after starting the first oscillator; counting a number N of cycles of the first oscillator until a reference point on the first signal coincides with a corresponding reference point on the second signal; if N is not at least equal to a threshold value altering the period of at least one of the oscillators and repeating these steps until N is at least equal to the threshold value.

In preferred embodiments of the invention, varying a period of at least one of the oscillators comprises changing a state of a controllable delay element.

A yet further aspect of the invention provides a method for time to digital conversion comprising providing first and second digital oscillators having periods which differ wherein the first and second oscillators are switchable between a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$; starting the first oscillator upon the occurrence of a first control signal and starting the second oscillator on the occurrence of a second control signal a time $T_d$ later; when the reference points occur within a known time delay of one another switching the oscillators to their second state; counting a number $N_C$ of edges of the first clock signal which occur between the first control signal and a time when the oscillators are switched to their second state; and, counting a number $N_F$ of edges of the first clock signal which occur between the time when the oscillators are switched to their second state and a time when the reference points have a known time relationship.

The method may include estimating the difference between the first and second oscillator periods ($T_{\Delta 2}$ and $T_{\Delta 1}$) by acquiring a first set of the numbers $N_F$ and $N_C$ for $T_d$ having a known value $T_{ref}$ while the known time delay has a first value and a second set of the numbers $N_F$ and $N_C$ for $T_d$ having a known value $T_{ref}$, or a known multiple of $T_{ref}$, while the known time delay has a second value, averaging $N_F$ and $N_C$ for each set of measurements and computing the resolutions $T_{\Delta 2}$ and $T_{\Delta 1}$ from the average values of $N_F$ and $N_C$ for the two sets of measurements.

Another aspect of the invention provides a frequency tunable digital ring oscillator comprising a closed signal path defined at least in part by a plurality of series connected delay elements each having an input and an output the delay elements comprising at least one digitally controllable delay element. The digitally controllable delay element comprises a gate connected in series with the signal path and a tri-state device having an input connected to an output of the gate and a control connection connected to a control device.

The tri-state device may be a tri-NOT gate or a tri-state buffer, for example.

Further features of various embodiments of specific embodiments of the invention.

BRIEF DESCRIPTION OF THE DRAWINGS

In figures which illustrate non-limiting embodiments of the invention.

DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative, rather than a restrictive, sense.

In this description, a variable denoted by t refers to an instant in time, T refers to a time interval, and τ refers to a time delay associated with the operation of a physical structure, such as a gate or a latch. In this description the following notation is used:

- $t_{START}$—the time of the START event (typically this is the time when the START signal is set HIGH);
- $t_{STOP}$—the time of the STOP event (typically this is the time when the STOP signal is set HIGH);
- $T_d=t_{STOP}-t_{START}$ the time interval to be measured;
- clkA the output signal produced by oscillator 40A;
- clkB the output signal produced by oscillator 40B;
- $T_A$—the period of clkA;
- $T_B$—the period of clkB;
- $t_{X(I)}$—the time at which the $i^{th}$ rising edge of clkX (X=A or B) occurs;
- $T_\Delta=T_A-T_B$ the time quantization step or resolution;
- $N_C$—a coarse generated by the time quantizer 30;
- $N_F$—a fine value generated by the time quantizer 30;
- $M_A$—the output state of counter 70A; and,
- $M_B$—the output state of counter 70B.

Figure 1A:
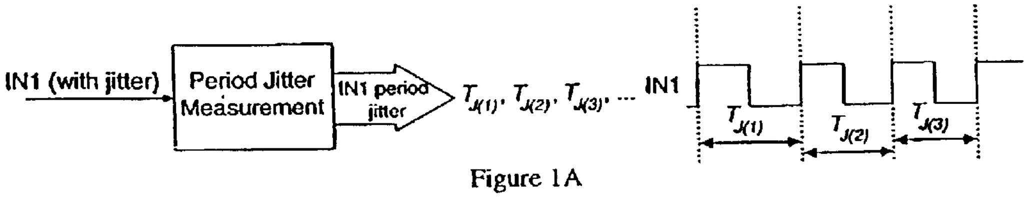
FIGS. 1A, 1B and 1C are schematic block diagrams which illustrate respectively how period, accumulative jitter, and relative jitter can be measured through the use of a TDC.
Figure 1B:
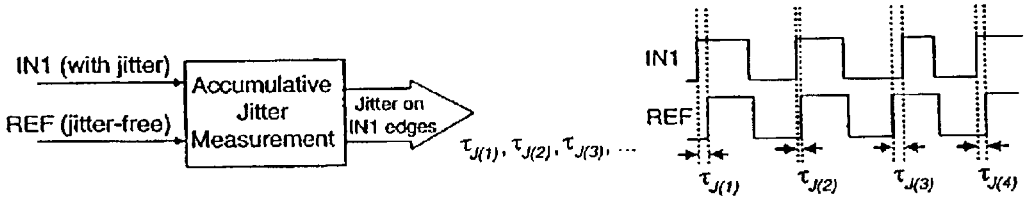
Figure 1C:
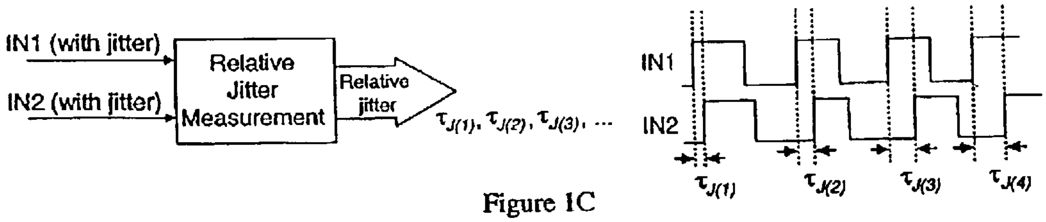
Figure 2:
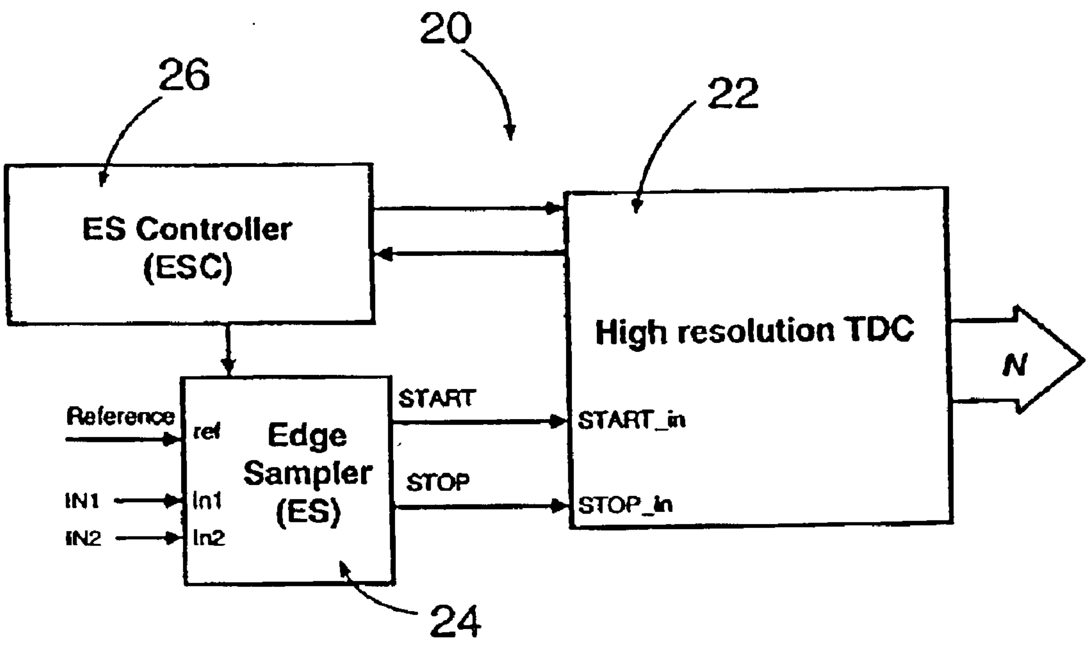
FIG. 2 is a block diagram illustrating major components of a jitter measurement circuit according to the invention.

This invention provides digital circuits which are capable of measuring jitter in digital signals with high resolution. The circuits may be used to measure jitter characteristics of timing circuits including, for example, PLLs and may also be used to measure jitter in other signals. FIG. 2 shows a digital circuit 20 according to the invention. Circuit 20 includes a high-resolution time-to-digital converter 22. TDC 22 measures the duration of a time interval $T_d$ between a start event and a stop event. In the illustrated embodiment of the invention, an edge sampler 24 generates the start and stop events. The start and stop events may respectively be, for example, particular edges of START and STOP signals. Edge sampler 24 is controlled by an edge sampler controller 26.

Under the control of edge sampler controller 26, edge sampler 24 selects the appropriate START and STOP edges and passes them to TDC 22. Edge sampler 24 and edge sampler controller 26 can preferably be configured for measuring various jitter specifications as described in more detail below.

Figure 3:
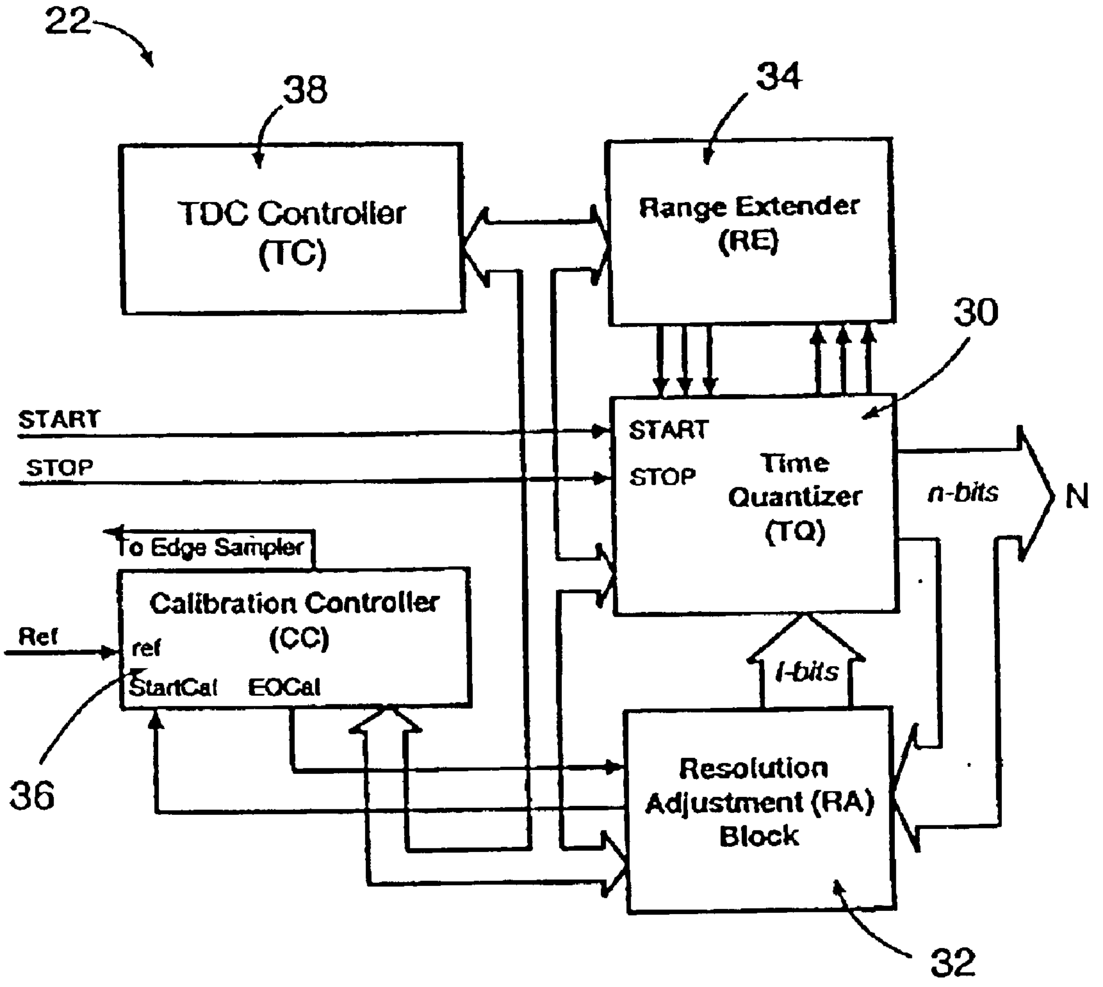
FIG. 3 is a block diagram of a TDC circuit according to the invention.

FIG. 3 illustrates a circuitry for one embodiment of TDC 22 suitable for use in this invention. TDC 22 includes a time quantizer 30 which quantizes time with a time resolution of $T_\Delta$. A resolution adjustment block 32 controls $T_\Delta$ to be less than a programmable threshold. A range extender block 34 extends the maximum time interval that time quantizer 30 is capable of measuring. A calibration circuit 36 is used to obtain a precise estimate of $T_\Delta$ with reference to a reference clock. A TDC controller 38 controls the overall operation of TDC 22.

Initially the resolution of time quantizer 30 is adjusted by resolution adjustment block 32 and time quantizer is calibrated. Then edge sampler controller 26 causes edge sampler 24 to generate START and STOP signals for a signal of interest and to pass pairs of START and STOP signals as samples to time quantizer 30 for measurement. Time quantizer 30 measures values related to the intervals between the START and STOP signals. These measured values can be used to determine jitter or other timing characteristics of the signal of interest, as described below.

Figure 4A:
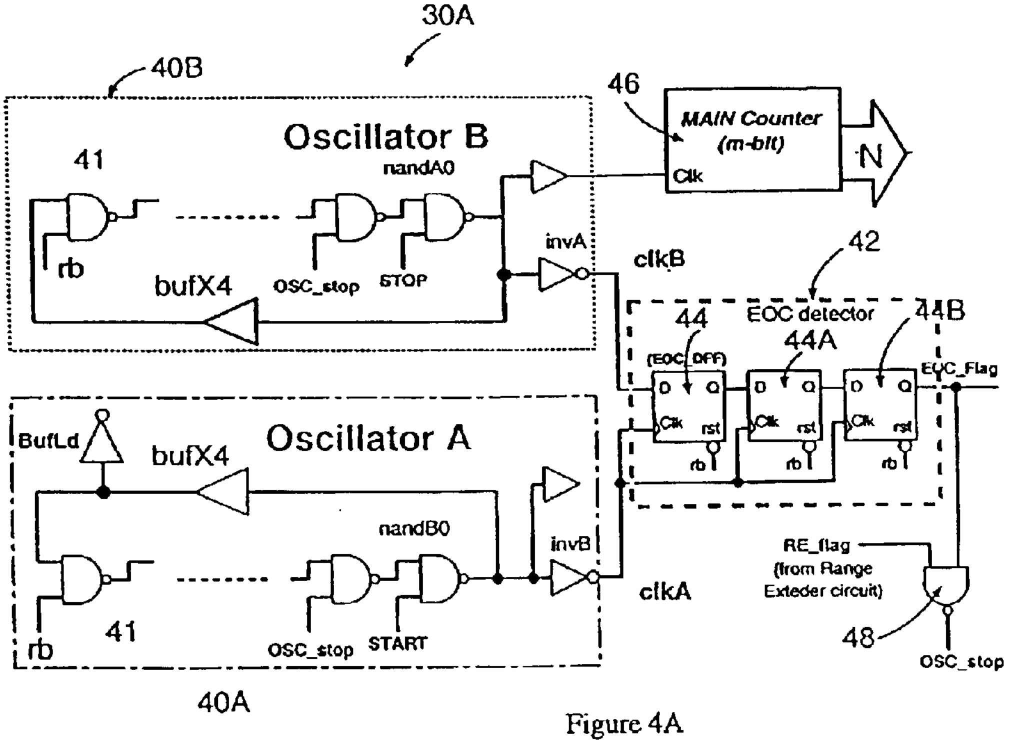
FIG. 4A is a schematic circuit diagram of a simple single resolution time quantizer according to the invention.
Figure 5A:
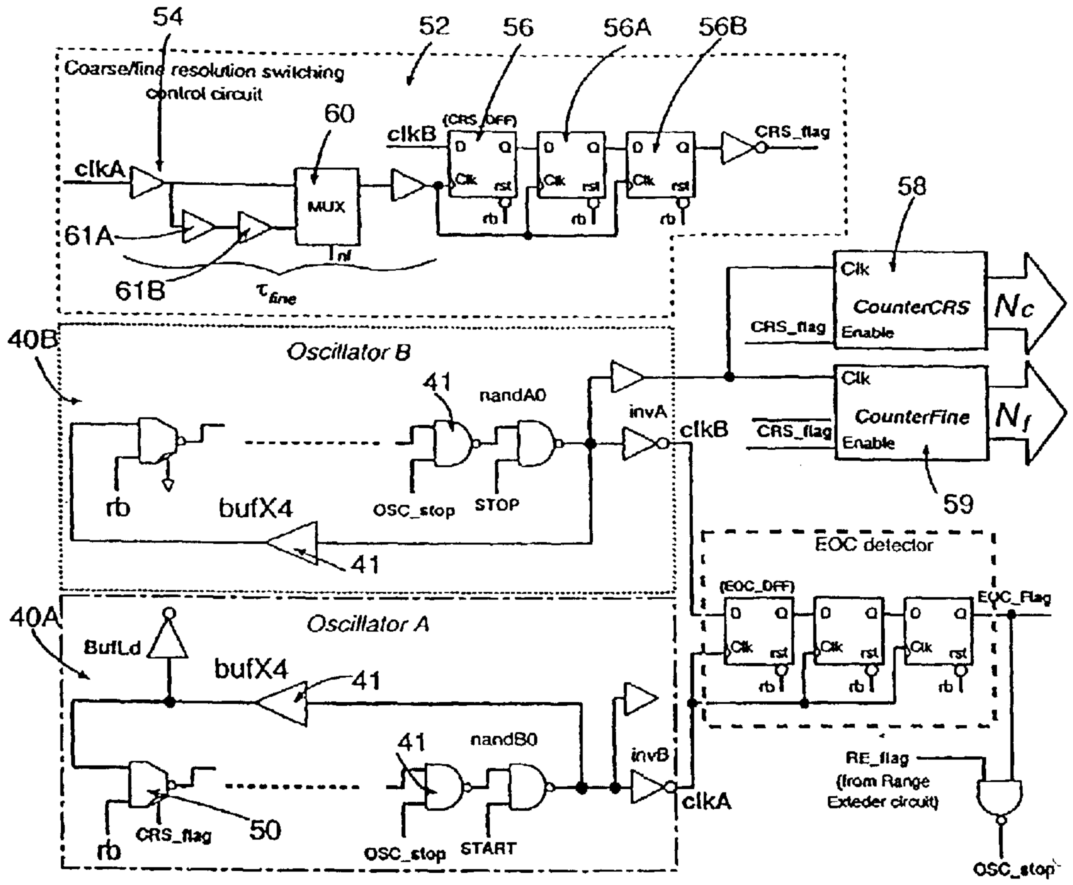
FIG. 5A is a schematic circuit diagram of a dual resolution time quantizer according to the invention.

A simple single resolution time quantizer 30A is shown in FIG. 4A. Time quantizer 30 may be constructed to provide multiple, preferably two, different resolutions. FIG. 5A shows a time quantizer 30B which provides coarse and fine resolutions. Referring to FIG. 4A, time quantizer 30A includes a pair of oscillators 40A and 40B (generally oscillators 40). Each oscillator 40 comprises a closed signal path along which a plurality of delay elements 41 are connected in series. Oscillators 40A and 40B have slightly different periods. Time quantizer 30 uses a differential method to obtain high resolution. This reduces the need for circuit matching.

The time quantizer 30A of FIG. 4A comprises oscillators 40, a coincidence detector 42 (in the illustrated embodiment, coincidence detector 42 comprises a flip flop 44) and a counter 46. The resolution of time quantizer 30A is determined by $T_\Delta$. The periods of oscillators 40A and 40B are set to be very slightly different so that $T_\Delta$ is a short time. $T_\Delta$ may be, for example, about 20 ps. $T_A$ is slightly larger than $T_B$.

Figure illustrates waveforms involved in the operation of time quantizer 30A. Oscillators 40A and 40B start oscillating on the rising edges of START and STOP respectively. Counter 46 starts counting on the rising edge of STOP. Coincidence detector 42 determines when reference points on the waveforms of clkA and clkB are in a known temporal relationship. In the illustrated embodiment, the reference points are the rising edges of clkA and clkB. Flip flop 44 samples clkB at the rising edge of clkA. If flip flop 44 detects that clkB has a value of HIGH then flip flop 44 sets EOC_flag. Assuming that $T_d$ is larger than $T_\Delta$, EOC_flag will be low for the first cycle of clkB. However, in each successive cycle of clkB, the rising edge of clkB gets closer to the corresponding rising edge of clkA by an amount $T_\Delta$.

Eventually the -th rising edge of clkB will precede the corresponding rising edge of clkA by at least the setup time of flip flop 44. When this occurs, EOC_flag changes state.

When EOC_flag changes state, the value in counter 46 is preserved. In the illustrated example oscillators 40 stop oscillating and counter 46 stops counting when EOC_flag is set HIGH. The value N in counter 46 indicates the value of $T_d$. In preferred embodiments, EOC_flag also initiates processing of data and prepares TDC 20 to measure another time interval.

Preferably coincidence detector 42 is constructed to avoid logic errors which might be caused by metastable behaviour of flip flop 44. Metastable behaviour may occur if, for some value of $T_d$, the interval between corresponding rising edges of clkA and clkB is within the metastability window of flip flop 44. Under these circumstances it may take significantly longer than $\tau_{CLK\text{-}to\text{-}Q}$ for the output EOC_DFF to switch to its HIGH state. If counter 46 were driven directly by the EOC_DFF signal output by flip flop 44 then this could cause an unknown clock state for counter 46.

In the illustrated embodiment, coincidence detector 42 comprises a triple flip flop synchronizer comprising flip flops 44, 44A and 44B. The output of flip flop 44B provides the EOC_flag signal. In this embodiment, if metastable behaviour of flip flop 44 prevents EOC_DFF from settling to its HIGH value after the Nth rising edge of clkB then the decision to end the measurement will be made at the (N+1)th rising edge of clkB. This is because the relative delay between the (N+1)th edges of clkA and clkB is greater than the delay between the Nth edges of clkA and clkB by $T_\Delta$, which is much greater than the metastability window of flip flop 44. For example, the metastability window of flip flops in some 0.35 μm CMOS digital cell libraries is less than 0.01 ps. Since the metastability window of flip flop 44 is typically extremely short, it will not significantly affect the precision with which jitter can be measured.

It can be shown that the value N in counter 46 at the end of conversion is related to $T_d$ as follows:

$$NT_\Delta = T_d + T_C + T_Q + T_R \tag{3}$$

where $T_C$ is a constant offset time, $T_Q$ is the quantization error ($0 \leq T_Q \leq T_\Delta$), and $T_R$ is a random error due to intrinsic jitter of gates, flip flops and other components of TDC 20.

Completing one measurement takes some time. The amount of time required for each measurement depends upon the value of $T_d$. If the error terms of Equation (4) are negligible then the time $T_{meas}$ required for one measurement can be shown to be:

$$T_{meas} = NT_A = \frac{T_d + T_C}{T_\Delta} T_A \tag{4}$$

For example, if $T_C=0$, measuring an interval of 1 ns with a resolution of 10 ps requires a time of $200 \times T_A$. If $T_A=4$ ns then the measurement time will be approximately 800 ns.

Figure 4B:
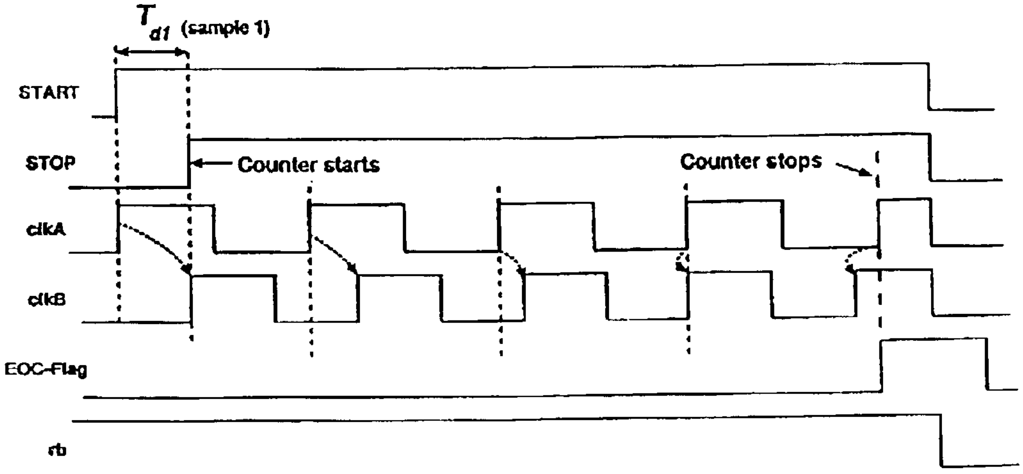
FIG. 4B illustrates waveforms of digital signals at various locations in the time quantizer of FIG. 4A.

Those skilled in the art will appreciate that time quantizer 30A has a limited valid measurement range. From the waveforms of FIG. 4B it can be seen that if: $T_d$ were larger than $T_A - DT_B$, where D is the duty cycle of clkB, then flip flop 44 will sample a HIGH value on the second rising edge of clkA. This would signal an end of conversion prematurely. It can also be seen that if $T_d$ is less than $|\tau_B - \tau_A|$, where $\tau_A$ is the time between the application of the START signal to oscillator 40A and the first rising edge of clkA being applied to flip flop 44 and $\tau_B$ is the time between the application of the STOP signal to oscillator 40B and the first rising edge of clkB being applied to flip flop 44 then flip flop 44 will sample a HIGH value on the first rising edge of clkB regardless of the value of $T_d$. This is because the first rising edge of clkB will occur when clkA is still HIGH.

Range extender block 34 inhibits the operation of coincidence detector 42 until time quantizer circuit 30A is in its valid measurement range. In the illustrated embodiment, a NAND gate 48 is connected between flip flop 44 and counter 46. NAND gate 48 prevents EOC_flag from being applied to preserve the value in counter 46 until range extender block 34 has generated a RE-flag signal.

Figure 6A:
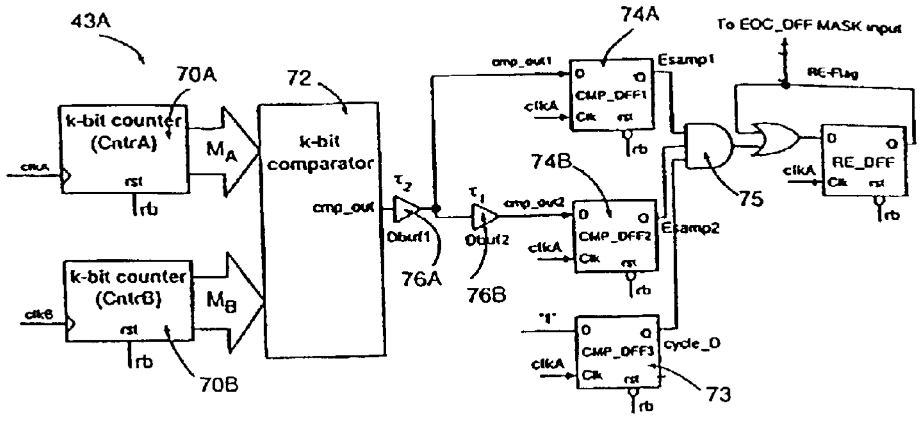
FIG. 6A is a schematic circuit diagram of a range extender circuit.
Figure 7A:
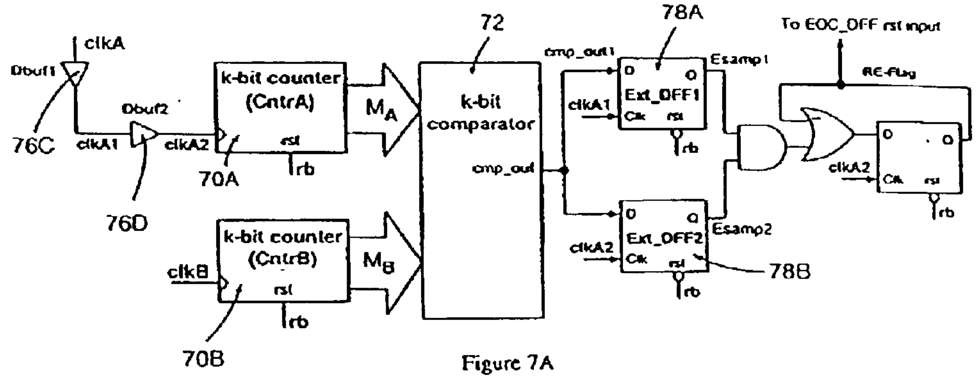
FIG. 7A is a schematic circuit diagram of an alternative range extender circuit.

Range extender block 34 may take various forms. One type of range extender uses a circuit which has delay elements in an input signal path. A range extender 34A which has this construction is shown in FIG. 6A. Another type of range extender uses a circuit which has delay elements in a clock signal path. A range extender 34B which has this construction is shown in FIG. 7A.

Figure 6B:
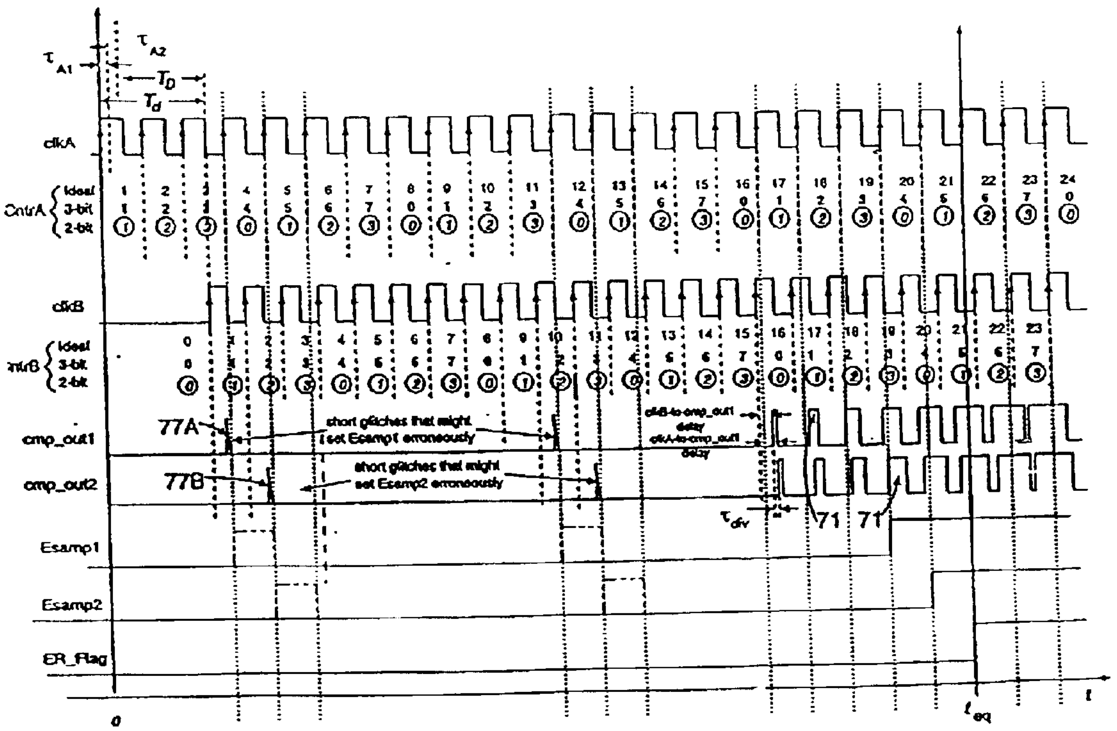
FIG. 6B illustrates waveforms of digital signals at various locations in the range extender circuit of FIG. 6A.

Range extender circuit 34A comprises four flip flops, two k-bit counters, a k-bit comparator, and two delay elements. FIG. 6B is a waveform diagram which illustrates signals at various points in range extender circuit 34A. Counters 70A and 70B respectively count the number of rising edges of clkA and clkB. Both counters are initialized to the same value, preferably zero. Since clkA is started before clkB, after the START signal starts clkA then counter 70A will contain a value $M_A$ which is greater than the value $M_B$ contained in counter 70B. The values of counters 70A and 70B are compared by comparator 72. The output of comparator 72 will go HIGH when $M_A=M_B$. RE_flag is set in response to comparator 72 detecting that $M_A=M_B$.

As noted above, $M_A$ and $M_B$ are initialized to the same value. To prevent RE_flag from being set prematurely, circuit 43A uses a flip flop 73. Flip flop 73 prevents the RE_flag signal from being set until the first rising edge of clkA has occurred, thereby ensuring that counter 70A is ahead of counter 70B.

When $t_{A(j)} - t_{B(I)} < T_A$ then $M_B$ may become equal to $M_A$ for a short period after a rising edge of clkB and before the next rising edge of clkA arrives. This may cause comparator 72 to generate a short pulse 71. Pulses 71 become wider at successive rising edges of clkB. When pulses 71 become sufficiently wide, a pulse 71 can be sampled at the same clkA rising edge by both of flip flops 74A and 74B. When all of flip flops 74A, 74B and 73 are set then the output of AND gate 75 changes state to cause the RE-flag to be set.

Since range extender circuit 34A operates asynchronously, a time diversity sampling technique is used to ensure valid sampling of the output of comparator 72. On each rising edge of clkA, counter 70A registers another count. For a short period after the rising edge of clkA, the output of counter 70A may have a transient random value. This random value, if equal to $M_B$, may cause comparator 72 to generate a short pulse, or glitch 77A (FIG. 6B) at its output. Counter 70B changes its count on the rising edges of clkB. For the same reasons, comparator 72 may generate a glitch 77B at its output shortly after a rising edge of clkB. It is desirable to prevent such glitches from prematurely setting RE_flag.

Delay elements 76A and 76B delay the application of the output of comparator 72 to flip flops 74A and 74B. The signals cmp_out1 and cmp_out2 which are applied to flip flops 74A and 74B respectively are delayed by different amounts $\tau_2$ and $\tau_2+\tau_1$. Choosing a delay element 76B which causes $\tau_2$ to be longer than the longest expected glitch ensures that neither of flip flops 74A or 74B will be set to HIGH as a result of such glitches.

The glitch width can be expected to be about ½ of the interval $\tau_{CLK\text{-}to\text{-}Q}$, where $\tau_{CLK\text{-}to\text{-}Q}$ is the worst-case CLK-to-Q delay for an output bit of counter 70B. This assumes that the worst case process variation of $\tau_{CLK\text{-}to\text{-}Q}$ is less than about ¼ $\tau_{CLK\text{-}to\text{-}Q}$. The expected worst case process variation of $\tau_{CLK\text{-}to\text{-}Q}$ may be determined by performing a monte-carlo analysis of the components of counter 70B.

Both of flip flops 74A and 74B must be set before the output of AND gate 75 will change state to set RE_flag. Delay element 76A causes flip flops 74A and 74B to sample the output of comparator 72 at different times. As the rising edges of clkA and clkB become closer together, in time the pulses output by comparator 72 become longer in duration. Eventually, the pulses are long enough in duration to trigger both of flip flops 74A and 74B on one rising edge of clkA. Delay element 76A is selected to provide a value of $\tau_1$ such that when both of flip flops 74A and 74B are triggered, $t_{B(I)} - t_{A(I)}$ is within the valid range described above. For example, where range extender circuit 34A is made using a 0.35 $\mu$m CMOS process, then $\tau_1$ may be selected as follows:

$$\tau_1 = T_A - \tau_{clkB\text{-}to\text{-}cmp\_out1} - T_C + 3T_{setup} \quad (5)$$

where $\tau_{clkB\text{-}to\text{-}cmp\_out1}$ is the delay between a rising edge of clkB and a corresponding rising edge of cmp_out1 and $T_{setup}$ is the maximum setup time for flip flop 44.

Range extender block 34 does not affect the ultimate precision or accuracy of any measurements made since it merely ensures that the $i^{th}$ rising edges of clkA and clkB are close enough for measuring by time quantizer 30. Range extender block 34 does not interfere with the path of signals clkA and clkB to EOC_flag. From FIG. 6B it can be seen that the range extension provided by range extender circuit 34A is as follows:

$$T_d < (2^k - 1)T_A \quad (6)$$

Figure 7B:
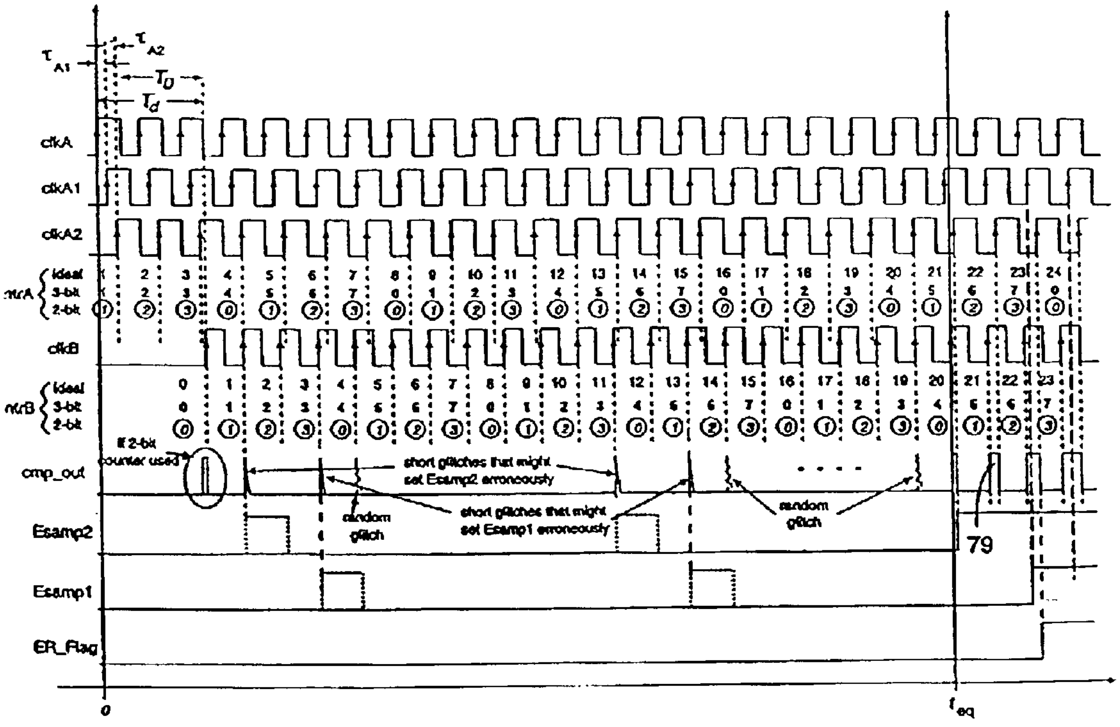
FIG. 7B illustrates waveforms of digital signals at various locations in the range extender circuit of FIG. 7A.

FIG. 7A shows an alternative range extender circuit 34B. FIG. 7B shows waveforms at various points in circuit 34B for the example of $T_d = 2.6\ T_A$. The core of circuit 34B comprises k-bit counters 70A and 70B which have outputs connected to a k-bit comparator 72. The output of comparator 72 is connected to the D inputs of flip flops 78A and 78B. Delay elements 76C and 76D are placed in the clock paths of counter 70A and flip flops 78A and 78B. These delay elements provide signals clkA1 and clkA2 which are delayed versions of clkA. Circuit 34B has the advantage that the desired values for the time delays produced by delay elements 76C and 76D do not depend on other time delays in the circuit. This feature makes range extender circuit 34B especially well adapted for field programmable gate array ("FPGA ") implementations of the invention.

In range extender circuit 34B, counters 70A and 70B are initialized to values which differ by 1. Preferably these counters are initialized to values of 1 and 0 respectively. Counter 70A counts rising edges of clkA2 and counter 70B counts rising edges of clkB. From FIG. 7B it can be understood that the number in counter 70A remains larger than the number in counter 70B as long as $t_{A2(i)} - t_{B(1)} > \tau_{A1} + \tau_{A2}$, where $\tau_{A1}$ and $\tau_{A2}$ are the delays produced by delay elements 76C and 76D respectively. When $t_{A2(1)} - t_{B(i)} < \tau_{A1} + \tau_{A2}$ then $M_A$ becomes equal to $M_B$ for a brief time. This causes comparator 72 to generate a pulse 79. Pulse 79 becomes wider at subsequent rising edges of clkB. When pulse 79 is wide enough that both of flip flops 78A and 78B become set at the same time then RE_flag is set.

Those skilled in the art will wee that both of range extender circuits 34A and 34B suppress the coincidence signal EOC-flag until corresponding edges of clkA and clkB are within one cycle of one another. In the case where clkA and clkB have duty cycles of 50%, circuits 34A and 34B suppress the coincidence signal EOC-flag until corresponding edges of clkA and clkB are within one half cycle of one another. In general, both of these example circuits operate on edges of clkA and clkB and are configured to suppress the coincidence signal EOC-flag until a time when no other edges of clkA and clkB are between corresponding edges of clkA and clkB.

Figure 5B:
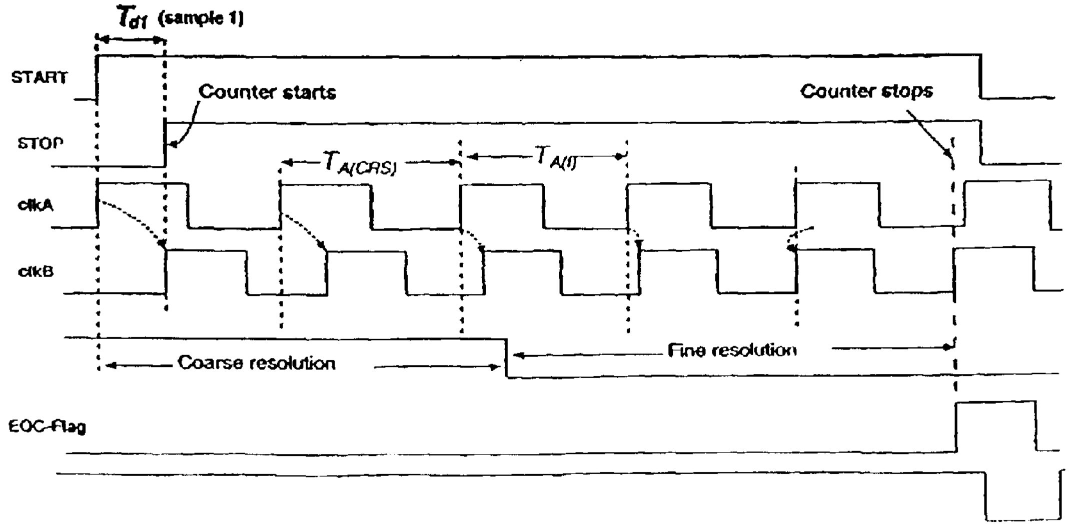
FIG. 5B illustrates waveforms of digital signals at various locations in the time quantizer of FIG. 5A.

Referring now to FIG. 5, a dual resolution time quantizer 30B also has two oscillators 40. Oscillators 40A and 40B begin oscillating at the rising edges of START and STOP respectively. In time quantizer 30B, oscillator 40A includes a delay element 50 which selectively provides either a shorter delay or a longer delay depending upon the value of a control signal, CRS_flag. During a first part of a measurement cycle delay element 50 is set to provide a longer delay. This causes $T_\Delta$ to have a relatively large value $T_{\Delta C}$. During a second part of the measurement, control signal CRS_flag controls delay element 50 to provide a smaller delay. This reduces $T_\Delta$ to a smaller value $T_{\Delta F}$. Preferably $T_{\Delta C}$ is in the range of 5 to 30 times greater than $T_{\Delta F}$. Most preferably, $T_{\Delta C}$ is approximately 10 times greater than $T_{\Delta F}$.

During the first part of the measurement-cycle the successive rising edges of clkB approach the rising edges of clkA relatively quickly because $T_\Delta$ is relatively large. When the rising edges of clkB and clkA are separated in time by a value smaller than a threshold time interval then a coarse/fine resolution control circuit 52 causes control signal CRS_flag to switch delay element 50 to its low delay state. In effect, each measurement begins with a coarse resolution and switches to a fine resolution when the rising edges of clkA and clkB are becoming close to one another.

In the illustrated embodiment, resolution control circuit 52 comprises a delay line 54 which produces a version of clkA delayed by an interval $\tau_{fine}$ at the clock input CLK of a flip flop 56. clkB is connected to the D input of flip flop 56. When rising edges of clkA and clkB are separated by an interval of $\tau_{fine}$, or less, then flip flop 56 changes state and CRS_flag is set. A first counter 58 counts the number ($N_C$) of cycles of clkA which occur during the first part of the measurement cycle. A second counter 59 counts the number ($N_F$) of cycles of clkA which occur during the second part of the measurement cycle.

To prevent metastable behaviour of flip flop 56 from causing indeterminate states in counters 58 and 59, resolution control circuit 52 preferably comprises flip flops 56A and 56B. Flip flops 56, 56A and 56B together comprise a triple flip flop synchronizer as described above.

It can be shown that the numbers counted by coarse counter 58 and fine counter 59 are related to $T_d$ as follows:

$$N_{COARSE}T_{\Delta C} + N_{FINE}T_{\Delta F} = T_d + T_C + T_Q + T_R \quad (7)$$

where $T_d$, $T_C$, $T_Q$, and $T_R$, are as described above.

If the error terms in Equation (8) are negligible then the time required to take one measurement is given approximately by:

$$T_{meas} = (N_{COARSE} + N_{FINE})T_A = \left(\frac{T_d + T_C - \tau_{fine}}{T_{\Delta C}} + \frac{\tau_{fine}}{T_{\Delta F}}\right) \times T_A \quad (8)$$

For example, if $T_C = 0$, and $\tau_{fine} = 300$ ps then measuring an interval of 2 ns with $T_{\Delta C} = 50$ ps and $T_{\Delta F} = 10$ ps yields $N_{COARSE} = 34$ and $N_{FINE} = 30$. If $T_A = 4$ ns then the measurement time will be approximately 256 ns. It can be seen that this is significantly shorter than the time required to take a similar measurement using the single resolution time quantizer 30A.

Preferably resolution control circuit 52 is constructed to allow the value of $\tau_{fine}$ to be varied. In the illustrated embodiment, delay line 54 comprises a multiplexer 60 which permits one or more delay elements 61 to be either included or not included in the signal path of delay line 54. When delay elements 61 are included in the signal path of delay line 54, $\tau_{fine}$ has a value $\tau_{fineC}$. When delay elements 61 are not included in the signal path of delay line 54, $\tau_{fine}$ has a smaller value $\tau_{fineF}$. The ability to vary $\tau_{fine}$ permits the noise floor of time quantizer 30B to be estimated in the manner described below.

The time quantizer circuits described above rely on oscillators 40A and 40B having periods which differ by only a very small amount $T_\Delta$. Any mismatch in the gate delays or interconnect wiring between oscillators 40A and 40B can cause a significant increase in $T_\Delta$. The resolution and accuracy of the time quantizer are degraded if $T_\Delta$ increases. The mismatch could also result in $T_B>T_A$. This would prevent the time quantizer from functioning properly.

Figure 8:
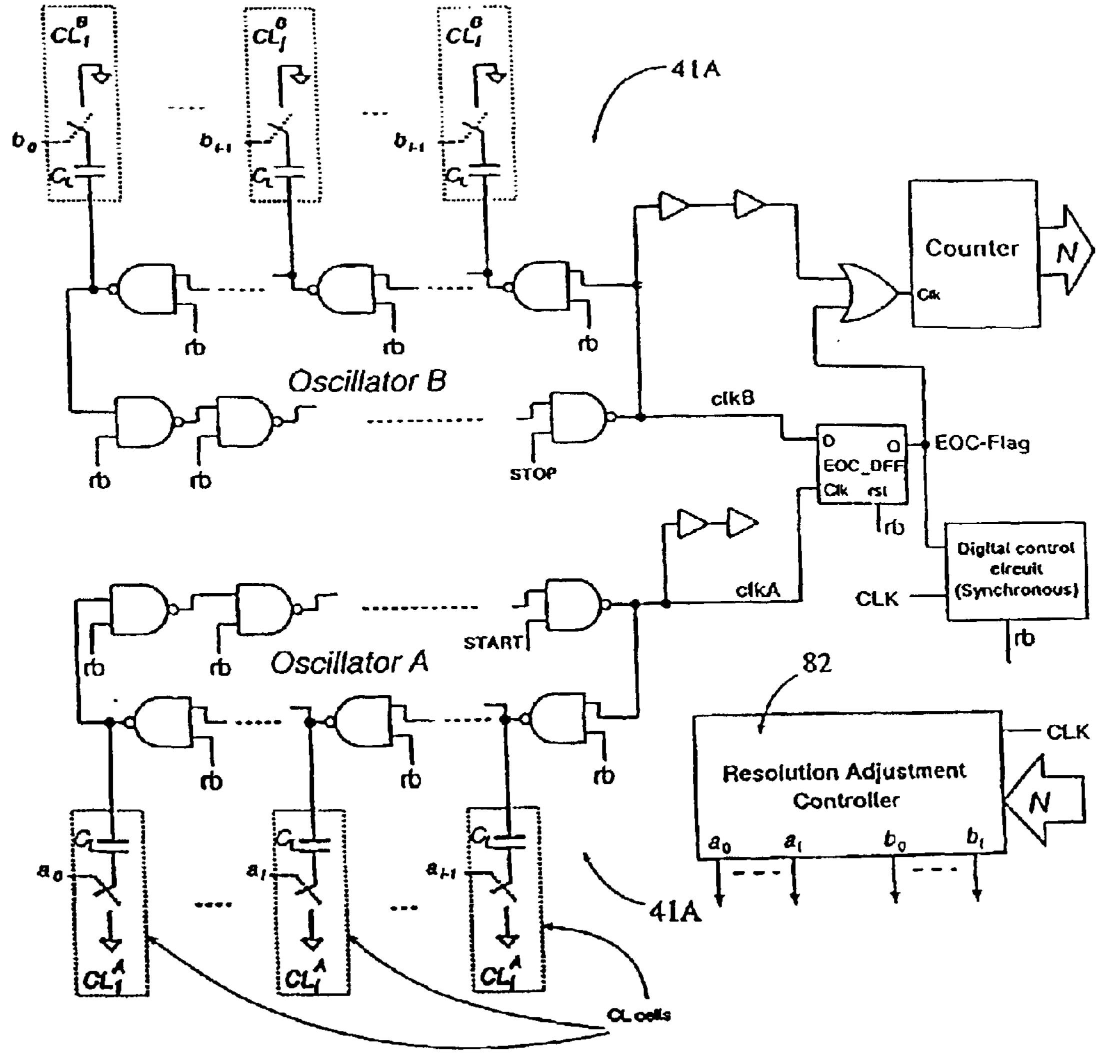
FIG. 8 is a schematic diagram of an automatic resolution adjustment circuit.

Oscillators 40 are preferably constructed in a manner which permits $T_\Delta$ to be set accurately. This may be done by constructing one or both of oscillators 40 using a plurality of controllable delay elements 41A. FIG. 8 shows a pair of oscillators 40 which each include a number of controllable delay elements 41A. Each controllable delay element 41A includes a control line which controls the controllable delay element to provide either a longer delay or a shorter delay. The controllable delay elements 41A are controlled digitally by a resolution adjustment controller 82 to achieve relative values for $T_B$ and $T_A$ such that $T_\Delta$ is less than a threshold $T_{th}$. $T_{th}$ is selected to provide a desired resolution and is preferably user configurable. This threshold may be supplied to the circuit as, for example, a digital number.

The amount of delay which a controllable delay element can add is given by:

$$\tau_{CDE}=\tau_{CDE(1)}-\tau_{CDE(0)} \tag{9}$$

where $\tau_{CDE(1)}$ and $\tau_{CDE(0)}$ are the delays provided by the controllable delay element when it is in its longer delay state and its shorter delay state respectively. Resolution adjustment controller 82 generates control signals for controllable delay elements 41A. At any time the state of controllable delay elements 41A can be represented by a pair of vectors, $\vec{a}=a_0, a_1, \ldots a_n$ and $\vec{b}=b_0, b_1, \ldots b_n$ where each element of the vector represents the state of one of the controllable delay elements 41A. Resolution adjustment controller 82 searches for vectors $\vec{a}$ and $\vec{b}$ which yield an acceptable value for $T_\Delta$ (i.e. $T_\Delta<T_{th}$).

In the currently preferred embodiment of the invention, resolution controller 82 causes time quantizer 30 to measure (in a single resolution mode) two known time intervals $T_{ref}$ and 2 $T_{ref}$. The time intervals may be, for example, the period of accurately known reference signals. The number of counts in counter 46 is obtained for each measurement and the numbers of counts are subtracted from one another to yield a difference $N_\Delta$. Assuming that measurement errors are negligible then $N_\Delta$ and $T_\Delta$ are related to one another by:

$$T_{ref}=N_\Delta T_\Delta \tag{10}$$

Since $T_{ref}$ is constant, a larger $N_\Delta$ corresponds to a smaller $T_\Delta$. For $T_\Delta$ to be smaller than $T_{th}$, $N_\Delta$ must be larger than some corresponding value $N_{th}$. Resolution adjustment controller switches controllable delay elements 41A between their states until it finds a combination in which $N_\Delta<N_{th}$. The steps implemented by resolution adjustment controller to most efficiently seek appropriate vectors $\vec{a}$ and $\vec{b}$ will depend upon how much delay can be added by each controllable delay element 41A.

Oscillators 40 may be constructed so that all of controllable delay elements 41A are designed to be the same. Process variations will result in variations of the delays provided by the controllable delay elements 41A. Preferably each controllable delay element 41A is constructed so that the nominal delay, $T_{step}$, added by each controllable delay element is less than ½ $T_{th}$. This can be done by choosing appropriate sizes for the components used in the controllable delay element 41A.

When this construction is used, as vector $\vec{a}$ (or vector $\vec{b}$) steps through values from 0, . . . , 0 to 1, . . . , 1 then $T_\Delta$ can be stepped in increments of ½ $T_{th}$, or less. As long as the initial difference between $T_A$ and $T_B$ is in the range of (−½ (−1)$T_{th}$, ½(−1)$T_{th}$) then there exist vectors $\vec{a}$ and $\vec{b}$ such that $T_\Delta<T_{th}$.

On a real chip it is difficult to guarantee the uniformity of the steps because the value of $T_{step}$ varies with process variations and is affected by the states of neighbouring controllable delay elements. Assume that $T_{step(l)}<T_{step}<T_{step(u)}$, where $T_{step(l)}$ and $T_{step(u)}$ are the lower and upper 3σ thresholds of the probability density function (PDF) of $T_{step}$ (these thresholds may be estimated by performing monte-carlo simulations of loaded ring oscillators). Then, as long as $T_{step(u)}<T_{th}$, vectors $\vec{a}$ and $\vec{b}$ that satisfy the resolution requirement can generally be found if:

$$-nT_{step(l)}<T_{A0}-T_{B0}<nT_{step(l)} \tag{11}$$

Where 3σ values of $T_{step(l)}$ and $T_{step(u)}$ are used, no more than about 1% of manufactured circuits will fail to be able to meet the desired resolution even though the values of $T_{step}$ are not uniform as a result of process variations. Where 6σ values are used, then fewer than about 0.1% of manufactured circuits will fail to provide the desired resolution.

Resolution adjustment will take the maximum time if all 2n+1 combinations of vectors $\vec{a}$ and $\vec{b}$ (each combination has a different numbers of 1's in vector $\vec{a}$ or $\vec{b}$) must be tried to achieve the required resolution.

If $T_{step(l)}$ is small relative to $T_{th}$ then larger numbers of controllable delay elements 41A must be provided to ensure that a suitable value for $T_\Delta$ can be obtained even if $T_{A0}-T_{B0}$ is initially large.

Instead of making the delay provided by all of controllable delay elements 41A the same, oscillators 40 may be designed so that different controllable delay elements 41A provide different delays. Preferably the delays are related to one another in an ascending series to provide resolution adjustment steps of different sizes. Most preferably:

$$\tau_{CDE}A_i=(1+\xi)\tau_{CDE}A_{i-1} \tag{12}$$

where $0<\xi<1$ is a constant and $\tau_{CDEi}$ is the delay added by an $i^{th}$ one of controllable delay elements of an oscillator 40. For example, an oscillator 40 constructed with a series of controllable delay elements 41A such that $\tau_{CDE1}$=8 ps and $\xi$=0.5 can have its period adjusted in steps of 8 ps, 12 ps, 18 ps, 27 ps, 40.5 ps, 60.75 ps and so on.

To guarantee that oscillators 40 can be controlled to provide a value of $T_{66}$ smaller than $T_{th}$, The maximum size of the smallest step (taking into account probable process variations) should be smaller than $T_{th}$.

Where oscillators 40 are constructed to permit adjustment of $T_\Delta$ in steps of different sizes, then resolution adjustment controller may take advantage of the fact that both coarser and finer adjustment steps are available. This permits very fine resolutions (for example, resolutions on the order of 5 ps or less) to be achieved while reducing the average adjustment time. A binary search algorithm is preferably used to select vectors a and b which provide a resolution $T_\Delta<T_{th}$.

Figure 9A:
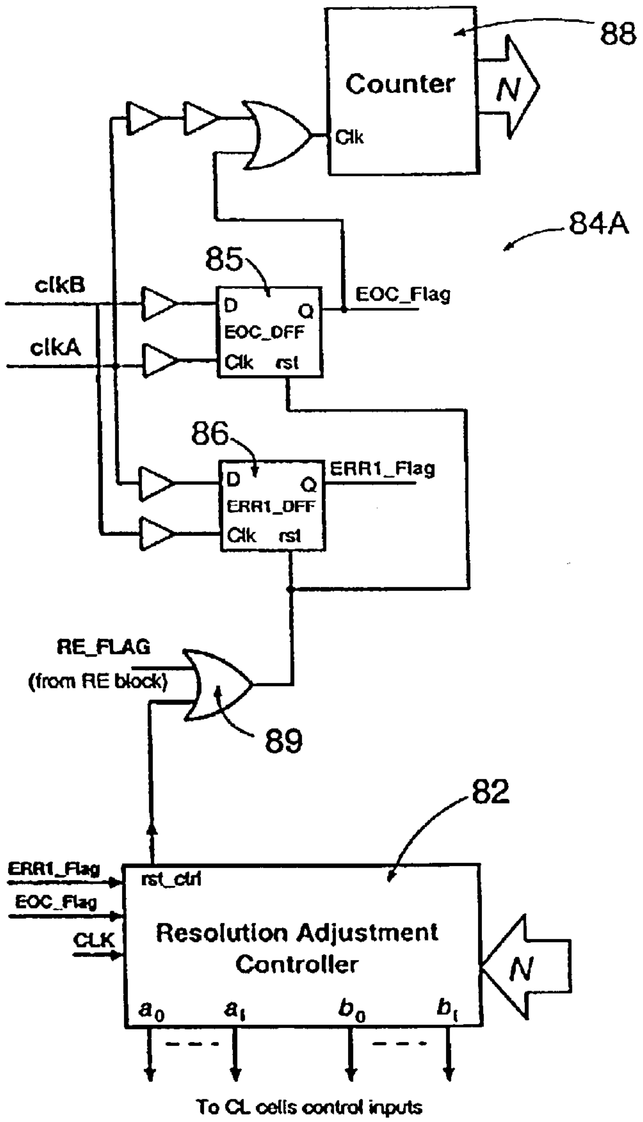
FIG. 9A is a TATB checker circuit.
Figure 9B:
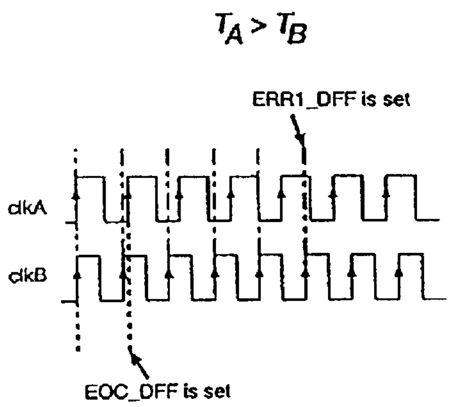
FIGS. 9B and 9C are waveforms at locations in the circuit of FIG. 9A for $T_A>T_B$ and $T_A<T_B$ respectively.
Figure 10A:
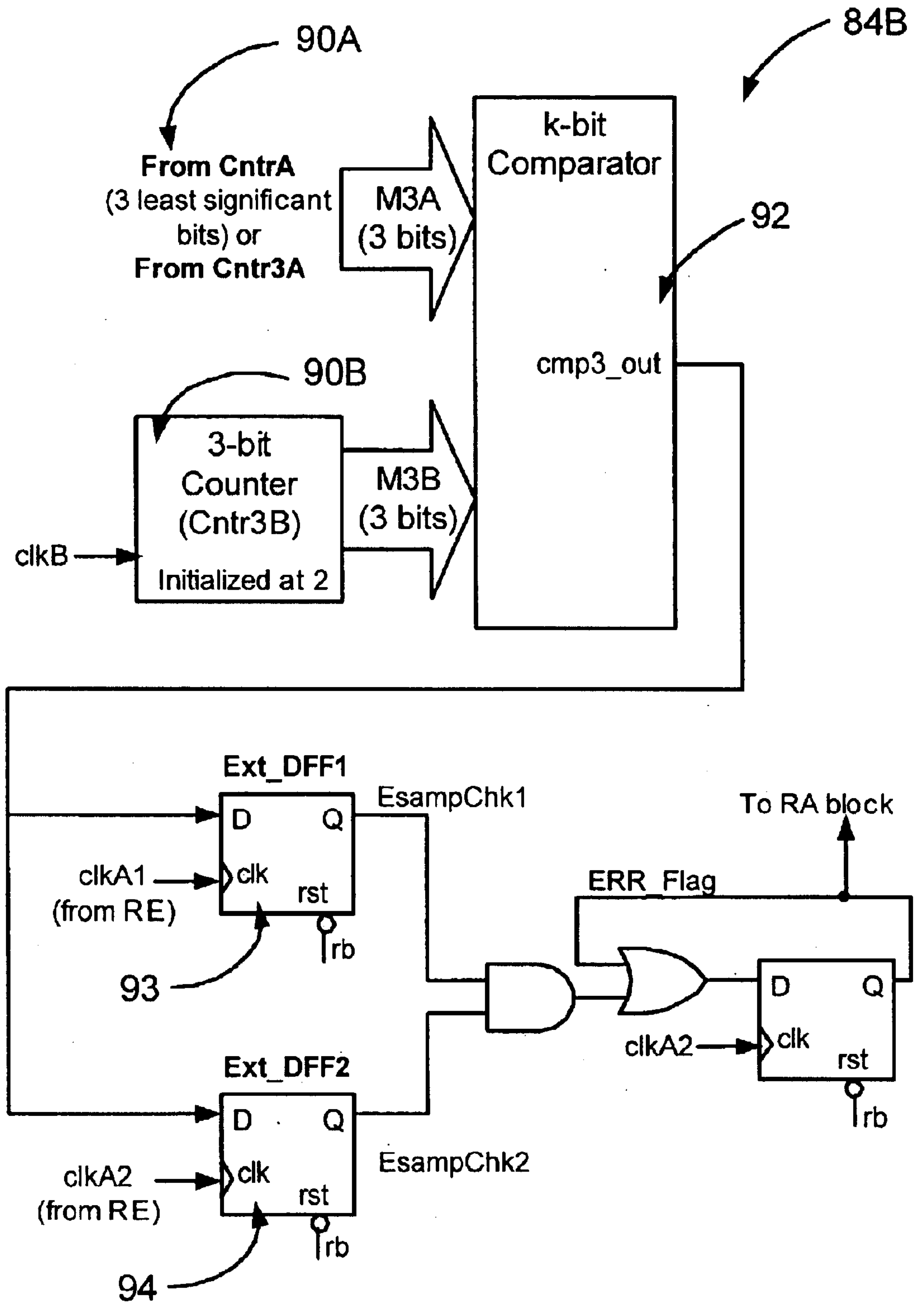
FIG. 10A is an alternative TATB checker circuit.

In addition to adjusting oscillators 40 to provide a desired value for $T_\Delta$, resolution adjustment controller 82 should check to ensure that $T_A>T_B$. A TATB checker circuit 84 may be used to perform this check. FIGS. 9A and 10A illustrate two alternative TATB checker circuits that may be used in practising this invention. TATB checker circuit 84A of FIG. 9A is used by triggering both of oscillators 40A and 40B at the same time (i.e. $T_d$=0). TATB checker circuit 84A includes a pair of flip flops 85, 86 and a counter 88. As the waveforms of FIG. 9B illustrate, when $T_A<T_B$, flip flop 85 samples LOW until the $i^{th}$ rising edge of clkA matches that of clkB. This occurs after $((D-1)T_A+T_C)/T_\Delta$ cycles of clkA. However, flip flop 86 samples a HIGH value after $T_C/T_\Delta$ cycles of clkA. Therefore flip flop 86 is set before flip flop 85.

Figure 9C:
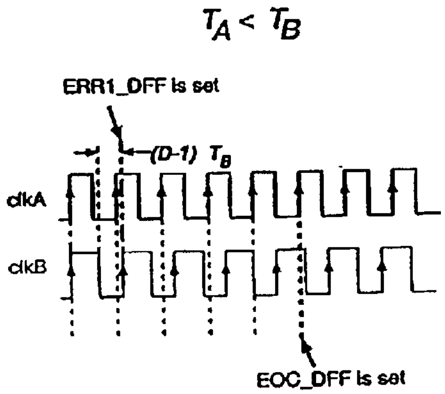

As seen in FIG. 9C, if $T_A<T_B$, the reverse occurs. Resolution adjustment controller 82 can check to ensure that $T_A<T_B$ by monitoring the two flags EOC_flag and ERR1_flag which are set by the outputs of flip flops 85 and 86 respectively. While the condition $T_A<T_B$ is being checked, the reset lines of flip flops 85 and 86 must be inactive. This is ensured in TATB circuit checker 84A by providing an OR gate 89 controlled by resolution adjustment controller 82. OR gate 89 maintains the reset lines of flip flops 85 and 86 LOW while a check is in progress.

For TATB circuit checker 84A to function properly the integer part of $((D-1)T_A+T_C)/T_\Delta$ must not equal the integer part of $T_C/T_\Delta$. Otherwise, both flags may be set in the same cycle of clkA. This requirement will generally be satisfied by typical designs. For example, in a circuit implementation in a 0.35 μm CMOS process, $(D-1)T_A$ is 1.5 ns, maximum $T_C$ is 0.4 ns and maximum $T_\Delta$ is 0.15 ns. In the worst case the integer part of $((D-1)T_A+T_C)/T_\Delta$ is 12 while the integer part of $T_C/T_\Delta$ is 2.

Since setup and hold times for flip flops 85 and 86 could be different, flip flops 85 and 86 might be set high simultaneously on the first or second rising edges of clkA and clkB. Such a case results in decision deadlock. The alternative TATB checker circuit 84B of FIG. 10A addresses this problem but is more complicated than circuit 84A. Circuit 84A may share components with time quantizer 30. For example, flip flop 85 may be the same flip flop as flip flop 44 of FIG. 4.

Figure 10B:
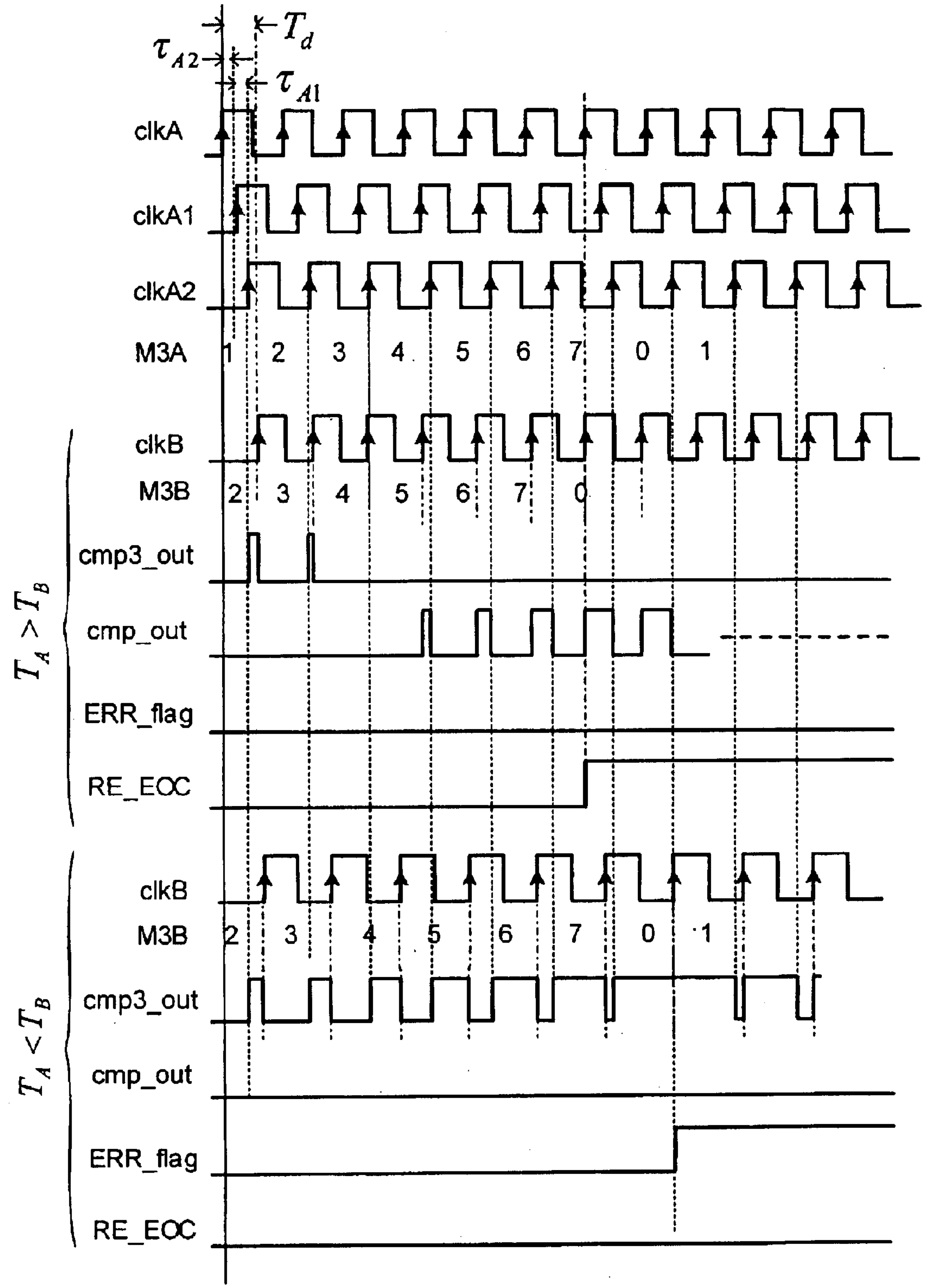
FIG. 10B illustrates waveforms of digital signals at various locations in the TATB checker circuit of FIG. 10A.

It can be seen from the waveforms of FIG. 10B that counter 70A (FIG. 6A) will count faster than counter 70B as long as $T_A<T_B$. This causes $M_A-M_B$ to increase as time passes. Assuming that $T_d=0$ the initial difference between the values in counters 70A and 70B will be either 0 or 1. If this difference becomes 2 or more, then it must be the case that $T_A<T_B$. TATB circuit checker 84B has a pair of counters 90A and 90B. Comparator 92 compares the values in counters 90A and 90B. Counter 90B is initialized to a value which is 2 larger than the initial value of counter 90A. For example, counters 90B and 90A are initialized to values of 2 and 0 respectively.

If the values in counters 90A and 90B become equal then comparator 92 generates a signal at its output which indicates that $T_A<T_B$. The techniques for reliably detecting when the values in counters 90A and 90B are equal which are described above in respect of range extender circuits 34A or 34B are preferably also used in TATB circuit checker 84B. In the embodiment illustrated in FIG. 10A the delayed clock signals clkA1 and clkA2 from range extender circuit 34B are connected to the clock inputs of flip flops 93 and 94.

TATB circuit checker 84B may share components with other circuits which are not required to operate while a TATB check is being performed. For example, counter 90A may comprise at least 3 significant bits of counter 70A of FIG. 4.

Figures 11A, 11B:
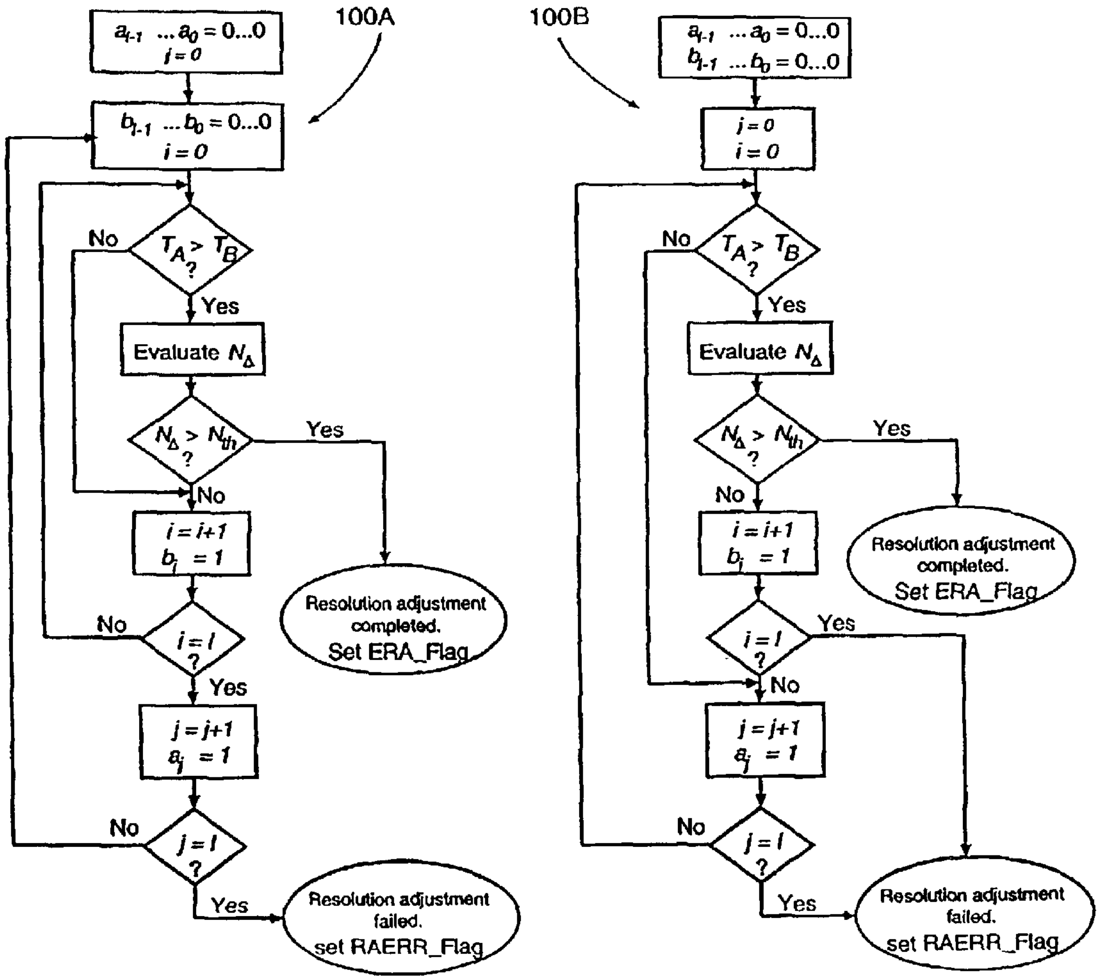
FIG. 11A is a flow chart illustrating an exhaustive search method for tuning a pair of oscillators to have a small period difference where controllable delay elements in the oscillators have fixed steps.
FIG. 11B is a flow chart illustrating a directed search method for tuning a pair of oscillators to have a small period difference where controllable delay elements in the oscillators have fixed steps.

If controllable delay elements 41A all provide substantially the same variation in $T_\Delta$ then one method that can be implemented in resolution adjustment controller 82 for selecting vectors $\vec{a}$ and $\vec{b}$ is to perform an exhaustive search. Resolution adjustment controller may comprise a state machine having an output for each controllable delay element in each of oscillators 40A and 40B where n is the number of controllable delay elements 41A in each of oscillators 40A and 40B. n of the state machine's output bits are connected to the n controllable delay elements of oscillator 40A and the other n output bits are connected to the n controllable delay elements of oscillator 40B. The state machine cycles through all possible combinations of a distinct vector $\vec{a}$ with a distinct vector $\vec{b}$ (in this case, two versions of a vector $\vec{a}$ are not considered distinct unless they have the different number of 1's. For example, $\vec{a}$=1100000 is not considered distinct from $\vec{a}$=1000100 because both of these vectors have two 1's in them). FIG. 11A shows steps in one possible exhaustive search method 100A for selecting vectors $\vec{a}$ and $\vec{b}$. If all distinct combinations of vectors $\vec{a}$ and $\vec{b}$ have been tried and no combination which provides an acceptable $T_\Delta$ has been found then an error signal is generated.

Figure 12:
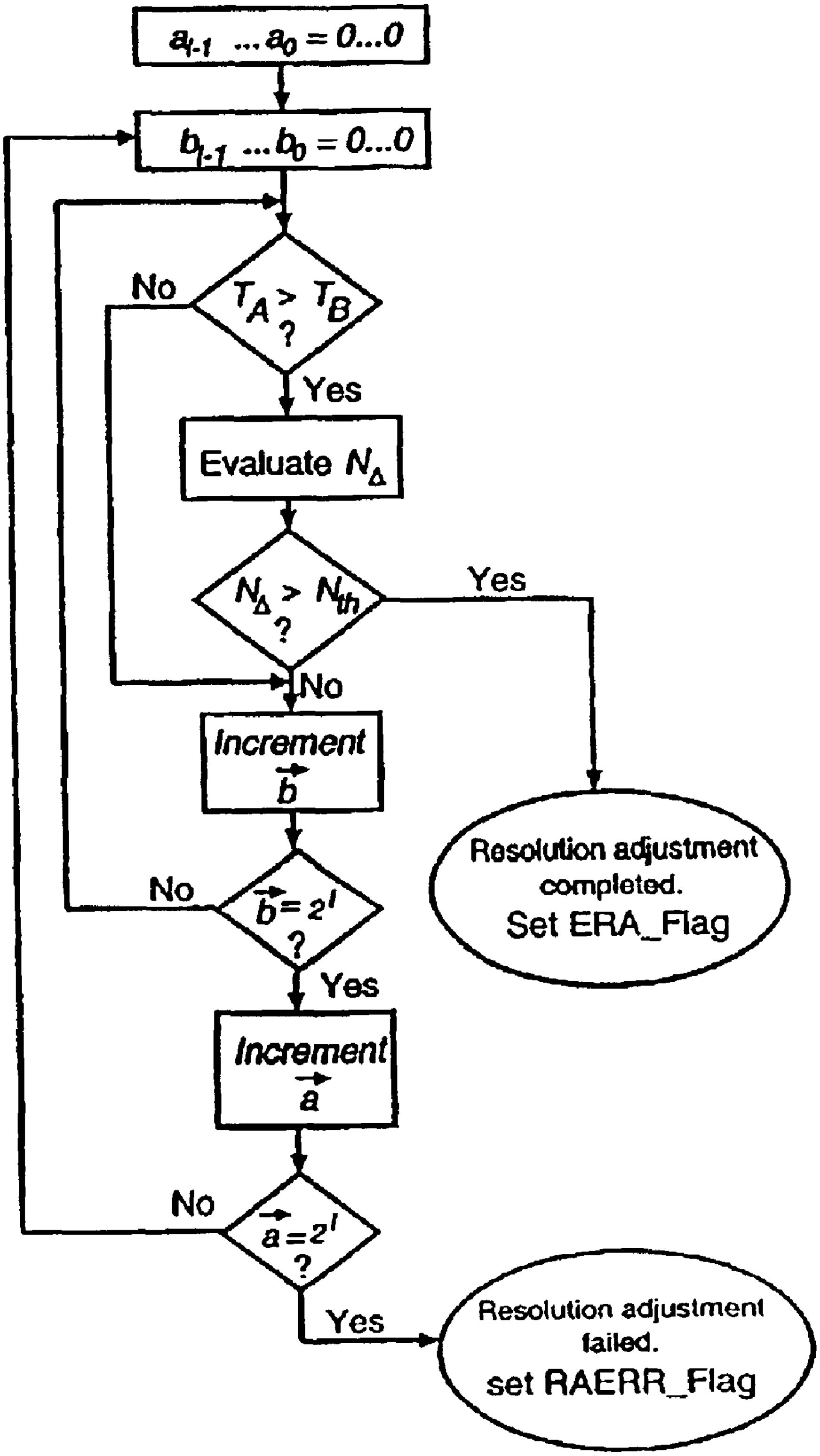
FIG. 12 is a flow chart illustrating an exhaustive search method for tuning a pair of oscillators to have a small period difference where controllable delay elements in the oscillators have incrementally varying steps.

One disadvantage of performing an exhaustive search is that it can be unnecessarily time consuming. To reduce time, an alternative method, 100B, which is shown in FIG. 11B may be used. Method 100B checks only distinct vectors $\vec{a}$ if $T_A<T_B$ and checks only distinct vectors $\vec{b}$ if $T_A>T_B$. This reduces the number of combinations that must be checked.

Where oscillators 40 are constructed with controllable delay elements which are designed to add different delays when activated then the exhaustive search strategy becomes less practical because it requires a much larger number of combinations of vectors $\vec{a}$ and $\vec{b}$ to be checked. Up to $2^{2n}$ combinations may need to be checked in the worst case. An exhaustive search can be implemented easily by providing a 2n-bit counter or LFSR in resolution adjustment controller 82 as shown in FIG. 12.

Figure 13:
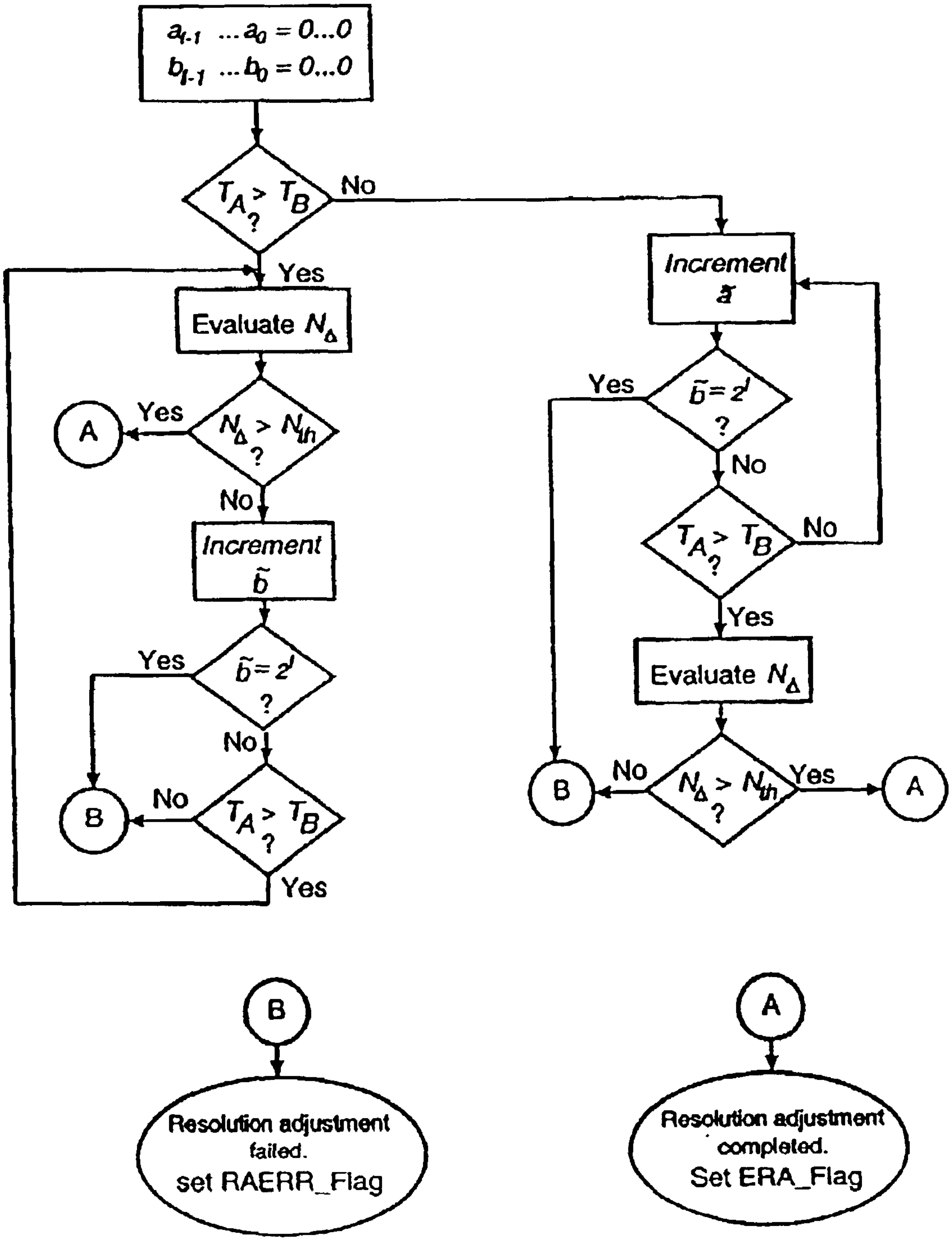
FIG. 13 is a flow chart illustrating a semi-exhaustive search method for tuning a pair of oscillators to have a small period difference where controllable delay elements in the oscillators have incrementally varying steps.

A semi-exhaustive search can be performed with similar hardware. The semi-exhaustive search increments either $\vec{a}$ or $\vec{b}$, depending upon whether $T_A>T_B$ or $T_B>T_A$. FIG. 13 is a flow chart which illustrates steps in a semi-exhaustive search method. In a semi-exhaustive search the maximum number of combinations tested is $2^n$.

Figure 14:
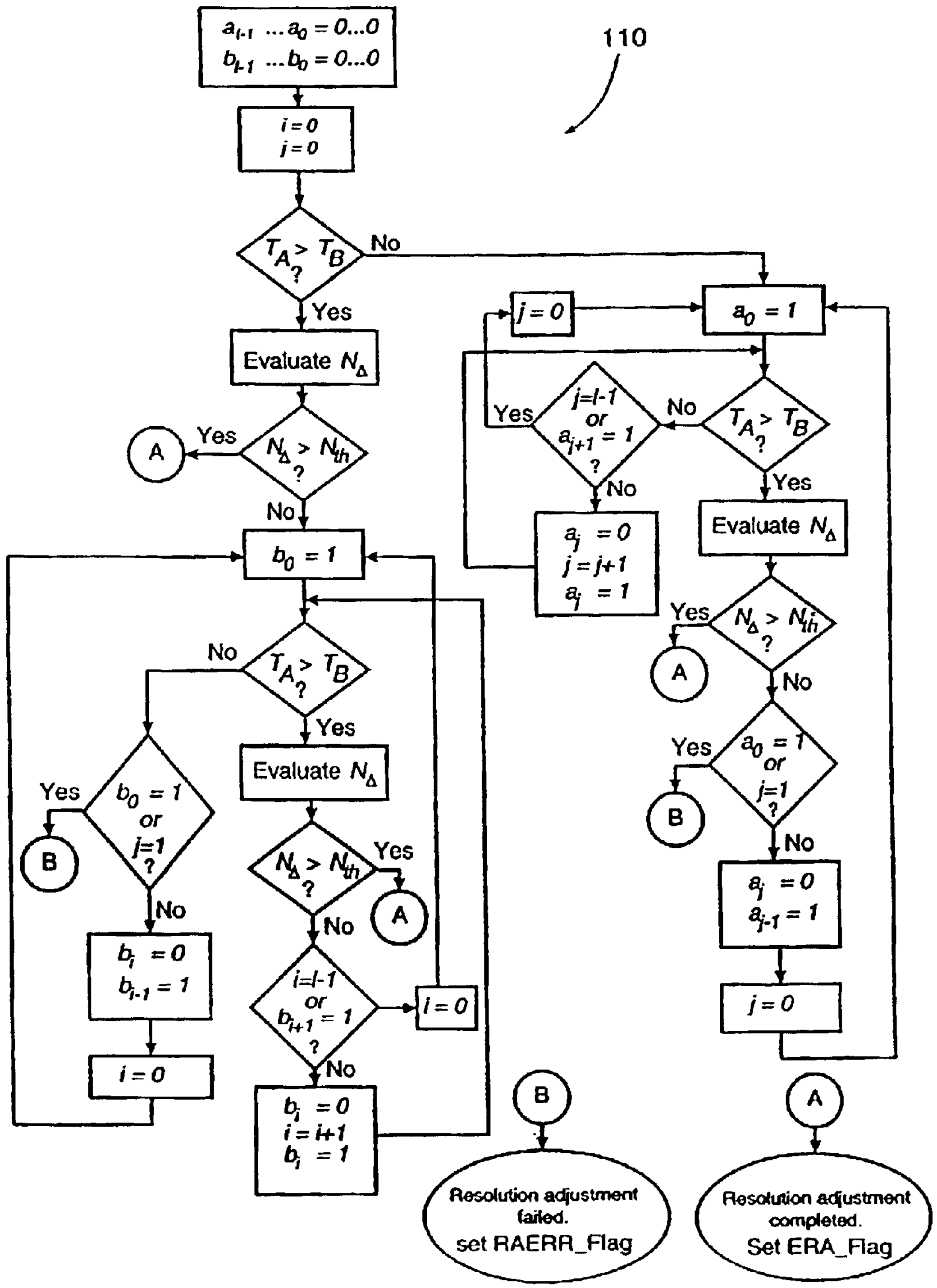
FIG. 14 is a flow chart illustrating a fast search method for tuning a pair of oscillators to have a small period difference where controllable delay elements in the oscillators have incrementally varying steps.

FIG. 14 depicts steps in a fast search method 110 that may be implemented in resolution adjustment controller 82. In method 110 if $T_A<T_B$ only $\vec{a}$ is adjusted because $T_A$ must be adjusted to obtain an acceptable value for $T_\Delta$. Similarly, if $T_A>T_B$, only $\vec{b}$ is adjusted to increase $T_B$. Since oscillators 40A and 40B are made to be very similar to one another, $T_A$ and $T_B$ will likely be initially close to one another. Therefore, the first choice is $\vec{a}$=0..0 and $\vec{b}$=0..0. If $N_\Delta<N_{th}$, the lowest significant bit of $\vec{a}$ (or $\vec{b}$) (depending on whether $T_A<T_B$ or $T_A>T_B$) is set high to increase $T_A$ (or $T_B$) by the smallest amount possible. If the required resolution is still not achieved, the next bit of $\vec{a}$ or $\vec{b}$ is set HIGH and all other bits are set LOW. This is continued until setting the I-th bit HIGH implies that or $T_A$ (or $T_B$) has been increased too much. Then the I-th and (I-1)-th bits are set LOW and HIGH, respectively, and the process starts over by setting bit 0. To illustrate method 110, assume that $T_A>T_B$, n=6 and the required resolution is ultimately achieved for $\vec{b}$=001001. The algorithm goes through the following sequence to find the required $\vec{b}$: 000000, 000001, 000010, 000100, 001000, 010000, 001001. This is in contrast with the exhaustive and semi-exhaustive searches, which go through the following sequence: 000000, 000001, 000010, 000011, 000100, 000101, 000110, 000111, 001000, 001001. As can be seen from above, the fast algorithm finds the solution in 7 steps, while the exhaustive and semi-exhaustive search each require 10 steps.

Controllable delay elements 41A can take any of various forms. Some types of controllable delay element may be made with standard digital cells. A controllable delay element may comprise a logic gate having a capacitive load provided by a load element. The load element permits the capacitive load to be digitally switched to different values. Each load element comprises a digital switch and a load. Turning on the switch increases the load applied to output of the corresponding logic gate. This results in a longer propagation delay. FIGS. 15A through 15E illustrate various types of load elements and their simplified models.

In designing load elements it is preferable to minimize the cell area required to provide a time difference $T_{diff}$. It is also desirable that $T_{diff}$ be relatively insensitive to variations in the control voltage $V_{ctrl}$. If $T_{diff}$ varies with fluctuations in $V_{ctrl}$, then any noise in $V_{ctrl}$ will add jitter to oscillators 40. This will increase $T_R$ with the result that time quantizer 30 will have reduced precision.

In the following description, $C_{gs(X)}$, $C_{gd(X)}$, $C_{gb(X)}$, $C_{db(X)}$, and $C_{sb(X)}$ are respectively the gate-source, gate-drain, gate-bulk, drain-bulk and source-bulk capacitances of the transistor $M_X$, where X is a transistor identifier. Values for$S^{T_{ctrl}}_{V_{ctrl}}$ are listed in Table I for various types of load element.

Figures 15A, 15B, 15C, 15D, 15E:
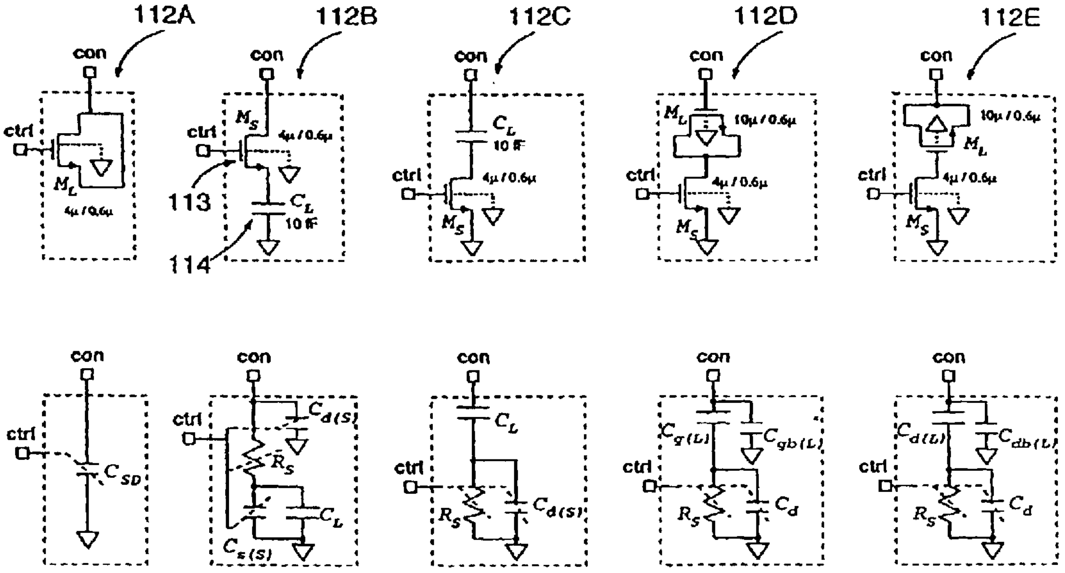
FIGS. 15A through 15E are schematic diagrams illustrating various types of load elements and their simplified models.

FIG. 15A shows a voltage-controlled NMOS load element 112A. Although element 112A provides a relatively large $T_{diff}$ in a small area, $T_{diff}$ is quite sensitive to $V_{ctrl}$because the equivalent capacitive loading of cell is a function of $V_{ctrl}$.

FIG. 15B shows a load element 112B in which the capacitive load is a capacitance 113. A simple model for such a load element has an ideal switch S, the switch resistance $R_S$, the switch drain capacitance $C_{d(S)}=C_{db(S)}+C_{gd(S)}$, the switch source capacitance $C_{s(S)}=C_{sb(S)}+C_{gs(S)}$, and the load capacitance $C_L$. $R_S$ is in the range of a few tens of MΩ when switch 114 is OFF and a few KΩ when switch 114 is ON. As is evident in the model, the $C_{d(S)}$ and $C_{s(S)}$ are also loading the oscillator. Since $C_{db(S)}$, $C_{gd(S)}$, $C_{sb(S)}$, and $C_{gs(S)}$ are functions of $V_{ctrl}$, this style of load element has a high $T_{diff}$ sensitivity to $V_{ctrl}$ and is therefore not preferred. Any load element having a switch connected to the oscillator node suffers from this high sensitivity characteristic.

FIG. 15C shows an alternative load element 112C and its simple model. In the model, $C_{d(S)}=C_{db(S)}+C_{gd(S)}$. This design provides a low $T_{diff}$ sensitivity to $V_{ctrl}$ because when switch transistor $M_S$ is ON, the impedance of $$C_{d(S)},\ Z_{d(S)} = \frac{1}{(2\pi f C_{d(S)})} >> R_s.$$

Therefore, the $C_{d(S)}$ variations do not affect the total loading provided by load element 112C significantly. Note also that variation in $R_S$ due to $V_{ctrl}$ does not affect the capacitive loading of the cell significantly. If the $M_S$ area is large such that $C_L<<C_{d(S)}$ and $Z_{d(S)}$ dominates (i.e. $Z_{d(S)}<<R_S$), then the load variation due to $V_{ctrl}$ variations is not significant because: $C_{L(con)}=C_LC_{d(S)}/(C_L+C_{d(S)})\sim C_L$. In this case, the effect of $R_S$ is significantly diminished, which means that the load variations for ON and OFF states of switch $M_S$ are small. This is a disadvantage when larger load variations are required. Therefore, special attention must be paid to switch size in this design. Load element 112C has the advantage that it occupies a small area for a given load. However, fabricating a load element 112C requires that the target technology permit fabrication of floating capacitors.

FIG. 15D shows a load element 112D similar to load element 112C except that a NMOS gate capacitor is used instead of a parallel-plate capacitor. In the associated model, $C_{g(L)}=C_{gs(L)}+C_{gd(L)}$ and $C_d=C_{sb(L)}+C_{db(L)}+C_{db(S)}+C_{dg(S)}$. The sensitivity of $T_{diff}$ to variations in $V_{ctrl}$ is only marginally greater than that of load element 112C. In the prototype implementation, described below a load element 112D that provides 10 ps delay in an area of a single-drive NOT gate which exhibits low sensitivity to variations in $V_{ctrl}$ is used.

The load element 112E of FIG. 15E shows a good insensitivity to variations in $V_{ctrl}$ but requires more area to achieve a given delay than does load element 112D. In the model for load element 112E, $C_{d(L)}=C_{gs(L)}+C_{gd(L)}$ and $C_d=C_{gb(L)}+C_{db(S)}+C_{dg(S)}$.

Figure 16:
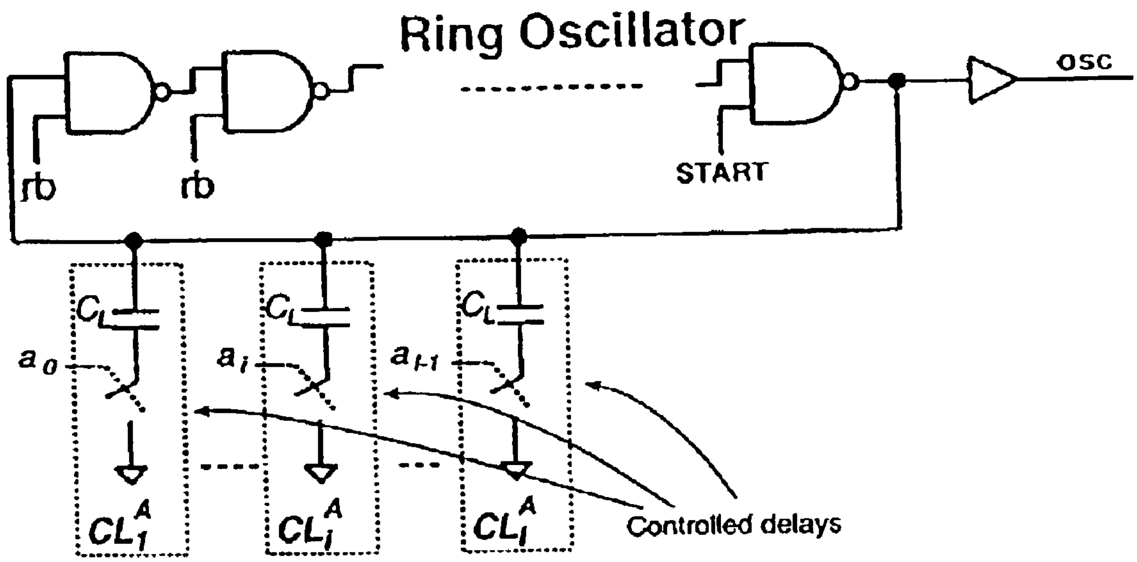
FIG. 16 is a schematic diagram of a circuit for testing the effect of control voltage variations on time delay provided by a controllable delay element.

Table I shows values for $T_{diff}$ for the load elements of FIGS. 15A through 15E. The numbers in Table I are for a test configuration shown in FIG. 16 in which either 1, 2, 3, 4, 5, or 6 load elements were turned on.

TABLE I

| | $T_{diff}$ for various control voltages | | | | | | | | |
|---|---|---|---|---|---|---|---|---|---|
| $V_{ctr1}$ | 2.5V | 2.6V | 2.7V | 2.8V | 2.9V | 3V | 3.1V | 3.2V | 3.3V |
| a1 | 24.3 | 25.9 | 27.4 | 28.9 | 30.2 | 31.5 | 32.8 | 34 | 35.2 |
| a2 | 75.7 | 80.3 | 84.7 | 89 | 93.4 | 97.7 | 101.6 | 105.8 | 109.5 |
| a3 | 154.6 | 162.9 | 170.9 | 179.8 | 187.9 | 195.9 | 203.7 | 211.2 | 218.7 |
| a4 | 269.1 | 284 | 299.1 | 314.2 | 328.5 | 342.7 | 356.2 | 369.4 | 382.1 |
| a5 | 423.8 | 447.5 | 471.5 | 495 | 518.2 | 540.4 | 561.1 | 581.8 | 601.8 |
| a6 | 636.4 | 672.7 | 708.7 | 743.5 | 777.7 | 811.1 | 843.4 | 875.1 | 905.2 |
| b1 | 57.4 | 61.6 | 65.89 | 70.2 | 74.3 | 78.4 | 82.4 | 86.5 | 90.2 |
| b2 | 142.8 | 153.2 | 163.6 | 173.9 | 184.3 | 194.7 | 204.7 | 214.6 | 224.3 |
| b3 | 250.2 | 268.8 | 287.3 | 306.1 | 324.6 | 342.9 | 361 | 378.9 | 396.4 |
| b4 | 387.5 | 417.3 | 446.9 | 476.5 | 506.4 | 535.6 | 564.8 | 593.8 | 622.2 |
| b5 | 555 | 598.3 | 642.3 | 686.2 | 730.1 | 773.9 | 817.1 | 859.9 | 902.5 |
| b6 | 771.5 | 834.7 | 898.6 | 962.8 | 1020 | 1090 | 1150 | 1210 | 1280 |
| c1 | 34.8 | 34.8 | 34.9 | 34.9 | 34.9 | 35 | 35 | 35 | 35 |
| c2 | 121.1 | 121.3 | 121.4 | 121.5 | 121.6 | 121.7 | 121.9 | 121.9 | 122.1 |
| c3 | 262.4 | 262.8 | 263.1 | 263.4 | 263.8 | 264 | 264.2 | 264.3 | 264.6 |
| c4 | 484 | 484.9 | 485.7 | 486.4 | 486.9 | 487.5 | 488 | 488.4 | 488.9 |
| c5 | 789.4 | 791 | 792.4 | 793.5 | 794.5 | 795.4 | 796.3 | 797 | 797.84 |
| c6 | 1248 | 1251 | 1253 | 1255 | 1257 | 1259 | 1260 | 1262 | 1263 |
| d1 | 9.44 | 9.47 | 9.43 | 9.44 | 9.45 | 9.39 | 9.44 | 9.55 | 9.49 |

TABLE I-continued

| $V_{ctrl}$ | $T_{diff}$ for various control voltages | | | | | | | | |
|---|---|---|---|---|---|---|---|---|---|
| | 2.5V | 2.6V | 2.7V | 2.8V | 2.9V | 3V | 3.1V | 3.2V | 3.3V |
| d2 | 33.19 | 33.25 | 33.35 | 33.53 | 33.59 | 33.67 | 33.69 | 33.73 | 33.8 |
| d3 | 73.19 | 73.4 | 73.62 | 73.95 | 74.19 | 74.33 | 74.37 | 74.59 | 74.62 |
| d4 | 130.3 | 131.1 | 131.5 | 131.9 | 132.3 | 132.8 | 133.1 | 133.4 | 133.7 |
| d5 | 210.6 | 211.7 | 212.5 | 213.2 | 213.9 | 214.6 | 215.2 | 215.7 | 216.3 |
| d6 | 316.9 | 318.7 | 320.6 | 321.6 | 323 | 324 | 325.1 | 326.2 | 327.1 |
| e1 | 0.844 | 0.825 | 0.904 | 0.757 | 0.891 | 0.938 | 0.952 | 0.791 | 0.761 |
| e2 | 3.33 | 3.27 | 3.3 | 3.26 | 3.35 | 3.16 | 3.47 | 3.19 | 3.31 |
| e3 | 7.14 | 7.16 | 7.18 | 7.28 | 7.42 | 7.14 | 7.27 | 7.15 | 7.31 |
| e4 | 15.72 | 15.83 | 15.68 | 15.73 | 15.71 | 15.73 | 15.75 | 15.82 | 15.77 |
| e5 | 28.17 | 28.42 | 28.25 | 28.49 | 28.29 | 28.41 | 28.41 | 28.41 | 28.62 |
| e6 | 49.38 | 49.47 | 49.56 | 49.4 | 49.46 | 49.47 | 49.56 | 49.53 | 49.48 |

Figure 17A:
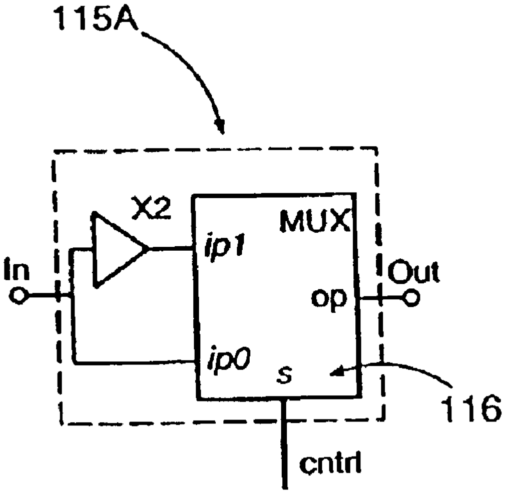
FIGS. 17A and 17B are schematic diagrams of controllable delay elements based on a multiplexer.
Figure 17B:
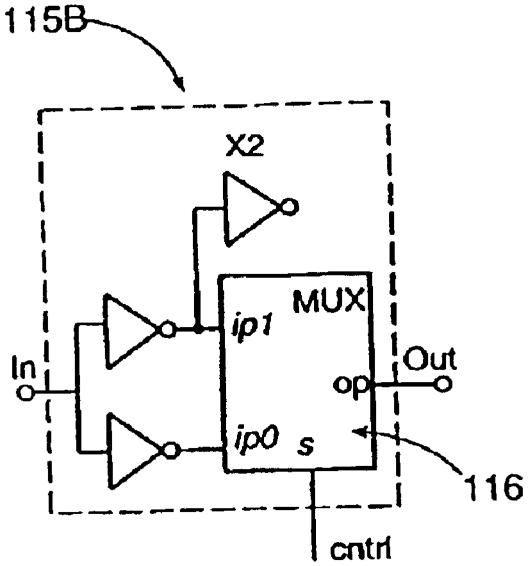

Controllable delay elements 41A may also be based on standard digital cells. This is preferable because there are some situations where it is not possible or practical to update a digital library for fabricating an oscillator for use in the invention. FIGS. 17A and 17B show two controllable delay elements 115A and 115B which each use a multiplexer 116 to select between two path segments for insertion into a signal path. Such controllable delay elements are useful especially where the controllable delay element should exhibit a large delay difference between its long delay and short delay states. Process variations typically cause different multiplexers made according to the same design to exhibit significant differences in propagation delays. These process-dependent variations could mask small differences in delay between the two path segments. A multiplexer-based controllable delay element is particularly useful for achieving a delay increment step of about 40 ps or more.

The delay difference in the two multiplexed path segments can be achieved by providing a different number of delay elements in the two path segments, as shown in FIG. 17A or by loading a delay element in one path segment differently from a corresponding gate element in the other multiplexed path segment as shown in FIG. 17B. The construction shown in FIG. 17B may be preferred where 20 ps<$\tau_{CDE}$<60 ps. The construction shown in FIG. 17A may be preferred where $\tau_{CDE}$>60 ps.

Figure 18A:
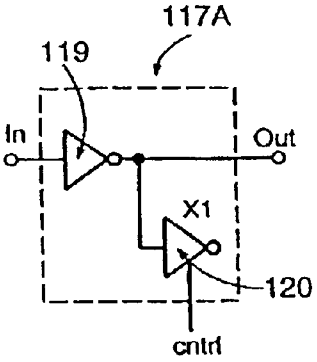
FIGS. 18A, 18B and 18C are schematic views of controllable delay elements in which a variable load is applied by the input of a tri-state device.
Figure 18B:
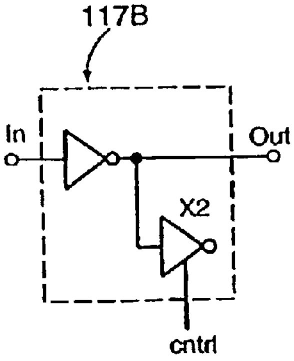
Figure 18C:
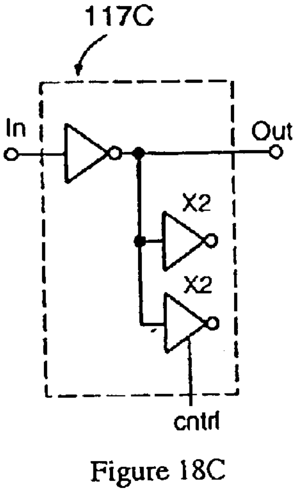

For achieving a very small $\tau_{CDE}$ on the order of a few picoseconds, one of the controllable delay elements of FIG. 18A, 18B or 18C may be used. In controllable delay element 117A of FIG. 18A, a logic gate 119 is loaded by the input of a tri-state NOT-gate (tri-NOT) 120. The delay of the element increases when tri-NOT 120 is activated.

Figure 19A:
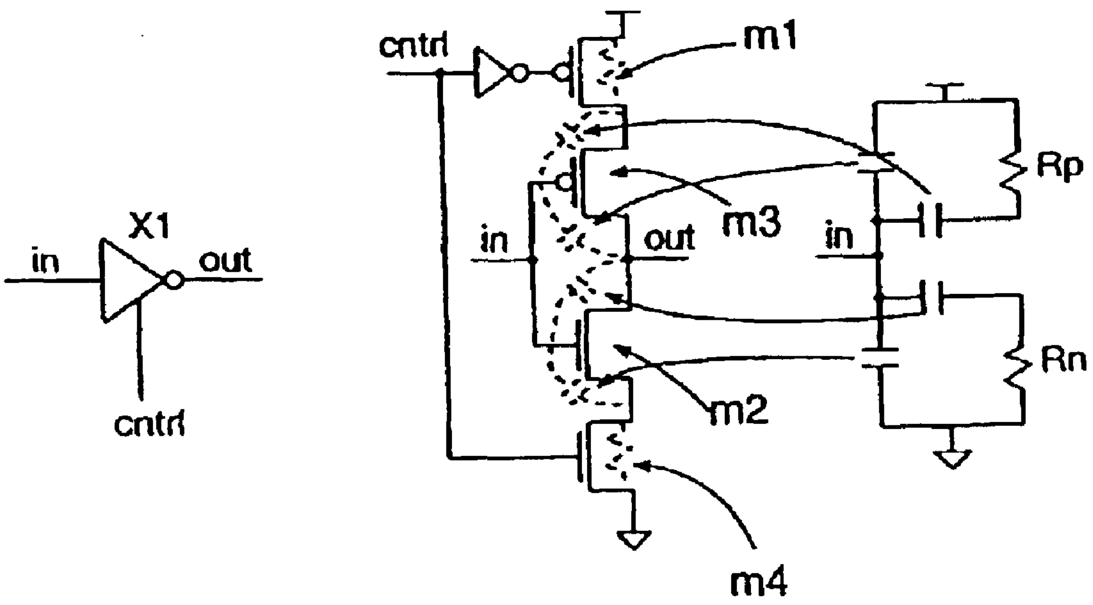
FIGS. 19A and 19B are schematic diagrams illustrating the structure of typical tri-NOT gates.
Figure 19B:
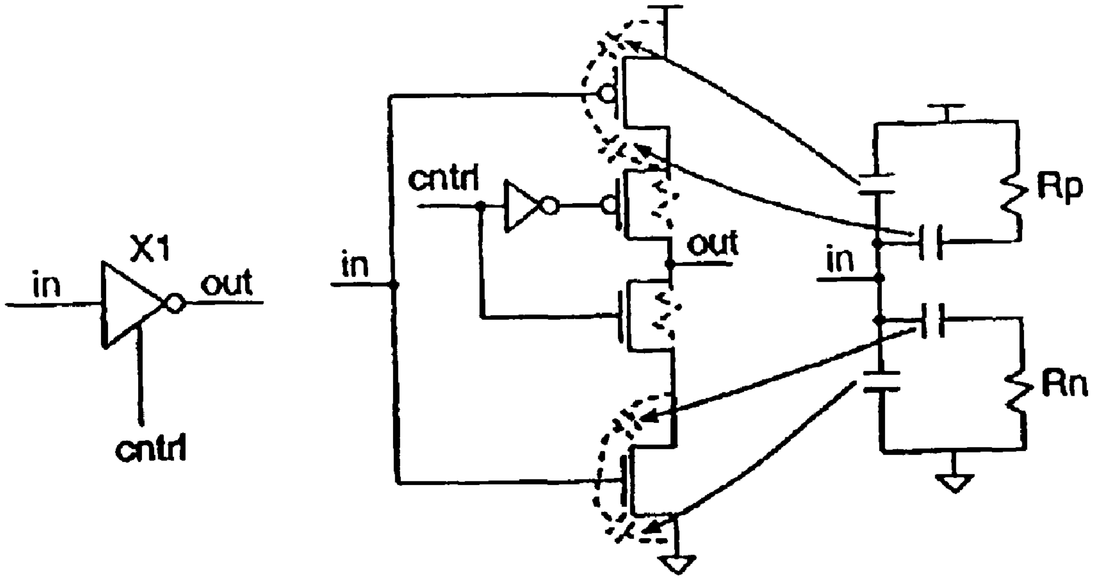

FIGS. 19A and 19B show two typical tri-NOT gate implementations as can be found in standard CMOS cell libraries. When the tri-NOT gate of FIG. 19A is inactive, the load $C_{gdp}+C_{gdn}$ is floating because these capacitances are in series with large impedances (transistors M1 and M4 are in high impedance mode). When M1 and M4 are turned on, these capacitances are added to the capacitive load on the input of the tri-NOT. A similar effect occurs when a tri-NOT as shown in FIG. 19B is activated. A value of $\tau_{CDE}$ of 3 ps or less may be obtained in a controllable delay element 117A made with standard 0.35 $\mu$m CMOS fabrication processes.

The additional capacitative loading provided by a tri-NOT gate when it is activated is a small percentage (typically about 5% to 10%) of its total loading. A controllable delay element 117A therefore is particularly useful where a very small value of $\tau_{CDE}$ is required. As shown in FIGS. 18B and 18C the value of $\tau_{CDE}$ can be changed by either using a different tri-state buffer as a load element or by adding additional load elements at the output of gate 119.

Figure 20A:
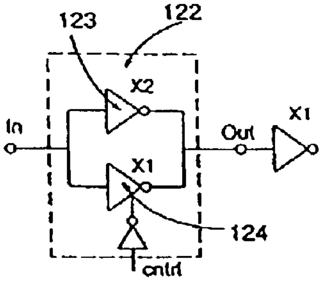
FIGS. 20A, 20B and 20C are schematic views of controllable delay elements having tri-state devices connected in parallel with other gates.
Figure 20B:
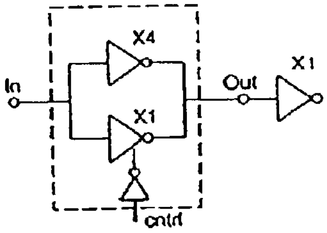
Figure 20C:
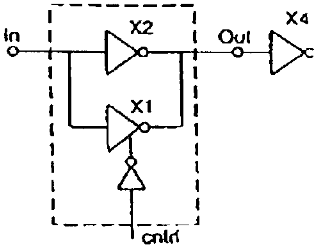

FIG. 20 shows a controllable delay element 122 which comprises a number of similar logic gates and tri-state gates connected in parallel. All of the gates should provide similar functions and have similar propagation delays. If they do not then logic contentions may occur at the outputs of each element. In the illustrated embodiment, a NOT gate 123 is connected in parallel with a tri-NOT gate 124. When it is inactive, the tri-NOT gate 124 contributes only an output load. NOT gate 123 provides drive current as well as load. When tri-NOT gate 124 is activated, it adds a small load to the output load and some drive current to the total drive. Depending on which of the additional load or drive current has the dominating effect the delay will increase or decrease. The delay which can be controlled by a controllable delay element 122 can be estimated by:

$$\tau_{CDE} = V_{dd}\left[\frac{C_\Delta / I_\Delta - C_{o(0)} / I_{o(0)}}{1 + I_{o(0)} / I_\Delta}\right] \tag{14}$$

where $C_{0(0)}$ and $I_{0(0)}$ are the output capacitance and drive current of delay element 122 when tri-NOT 124 is inactive and $C_\Delta$ and $I_\Delta$ are the additional capacitance and drive current when tri-NOT 124 is active.

Delay element 122 has the disadvantage that it suffers from large process variations. However, it may be used with good results for mid range values of $\tau_{CDE}$ (in the range of, for example, 20 ps to 50 ps). Delay element 122 has the advantage that it can be implemented with devices from a digital library which includes tri-state buffers but does not include tri-NOT gates. A delay element 122 can, for example, be implemented on a FPGA. In many FPGA block cells the only available tri-state devices are tri-state buffers.

A TDC 22 according to the invention is calibrated before it is used. Where time quantizer 30 is a single resolution quantizer (for example in a time quantizer which uses circuit 30A), the relationship between N and $T_d$ is linear. Therefore, if one knows $T_C$ and $T_\Delta$ then it is straightforward to calculate $T_d$ from N. To estimate $T_C$ and $T_\Delta$, two accurately known time intervals $T_{cal1}$, and $T_{cal2}$, which may be supplied from off-chip, are measured. The resulting numbers $N_1$ and $N_2$ are recorded. It can be shown that:

$$N_{cal1}T_\Delta = T_{cal1} + T_C + T_{Q1} + T_{R1} \tag{15}$$

and, $$N_{cal2}T_\Delta = T_{cal2} + T_C + T_{Q2} + T_{R2} \tag{16}$$

where $T_{Q1}$ and $T_{Q2}$ are quantization errors, and $T_{R1}$ and $T_{R2}$ are random errors associated with the first and second measurements respectively. Preferably $T_{cal1}$ and $T_{cal2}$ are chosen so that $N_{cal1}-N_{cal2}$>200.

$T_C$ and $T_\Delta$ may be estimated using a two-point calibration, in which case $T_{C0}$, the estimated value of $T_C$ is given by:

$$T_{CO}=\frac{T_{cal2}N_{cal1}-T_{cal1}N_{cal2}}{N_{cal2}-N_{cal1}} \tag{17}$$

and $T_{\Delta 0}$, the estimated value of $T_\Delta$ is given by:

$$T_{CO}=\frac{T_{cal2}-T_{cal1}}{N_{cal2}-N_{cal1}} \tag{18}$$

It can be shown that the error associated with the estimation of $T_\Delta$ is a random variable having a mean of zero and a variance given by:

$$\sigma^2_{T_{\Delta o}}=\frac{T_\Delta^2}{6(N_{cal2}-N_{cal1})^2}+\frac{2\sigma_R^2}{(N_{cal2}-N_{cal1})^2} \tag{19}$$

The error associated with the estimation of $T_C$ is also a random variable having a mean of $-T_\Delta/2$ and a variance given by:

$$\sigma^2_{T_{C_0}}=\left(\frac{T_\Delta^2}{12}+\sigma_R^2\right)\times\frac{(1+N_{cal2}/N_{cal1})^2}{(1-N_{cal2}/N_{cal1})^2} \tag{20}$$

A more accurate estimate of $T_C$ and $T_\Delta$ may be estimated using an n-point calibration. For an n-point calibration, n accurately known time intervals are measured by TDC 22. These time intervals are multiples or known fractions of a reference interval. An objective of n-point calibration is to limit the range of $T_Q$ variations and to therefore reduce $\sigma_{Tce}$.

Figure 21A:
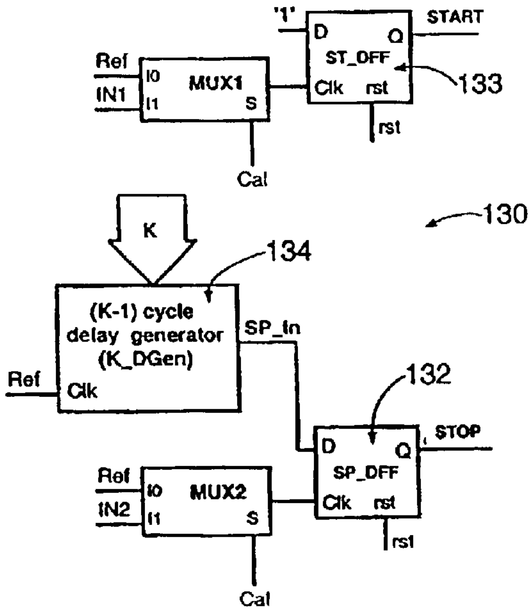
FIG. 21 is a schematic view of a selection circuit for providing a reference interval.
Figure 21B:
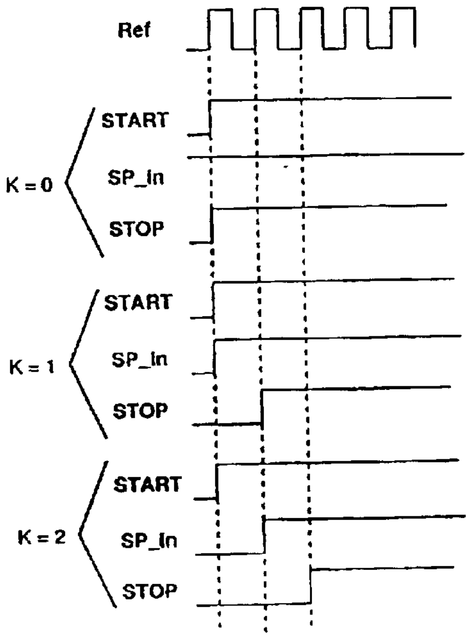

Since a low-jitter reference clock is often available on a chip for two-point or n-point calibration, it is convenient to choose $T_{cal1}=T_{ref}$, $T_{cal2}=2T_{ref}$, . . . , $T_{caln}=nT_{ref}$. A circuit 130 that allows reliable generation of $KT_{ref}$ intervals is shown in FIG. 21A. In circuit 130, when Cal=0, the Ref signal is connected to the clk inputs of flip flops 132 and 133. Since the D input of flip flop 133 is always HIGH, START is set high at the first rising edge of the Ref signal. The STOP signal always is set HIGH one Ref cycle after SP_In turns HIGH. Since the K_DGen state machine block 134 sets SP_In to HIGH (K−1) cycles after the rising edge of the Ref signal, a delay of K Ref cycles results between the edges of START and STOP. The waveforms in FIG. 21B illustrate the operation of circuit 130 for K=0, 1, and 2.

Constant delay is generated in the path of calibration signals in this circuit. The same delay will be used in the actual measurement, except for the term $\Delta\tau_{MUX1}-\Delta\tau_{MUX2}$ which represents the variation of the difference in propagation delays from I0 and I1 inputs to output in the multiplexers MUX1 and MUX2, respectively. This is important for making absolute measurements because, if the mismatch is significant, the value estimated for $T_C$ during calibration will not be the same as the one used in actual measurements. This would cause additional error.

Therefore, the Ref signal paths to clk inputs of flip flops 132 and 133 must be matched to the IN1 and IN2 signal paths to the same inputs, respectively. This is particularly important in high resolution measurement because on-chip matching of elements to a high resolution is very difficult. Here, it is assumed that this matching is achieved, and therefore the term a $\Delta\tau_{MUX1}-\Delta\tau_{MUX2}$ is negligible. This matching is not required when the calibration is being performed for making differential measurements because $T_C$ does not affect the accuracy or precision of differential measurements.

Where a double resolution time quantizer 30 is used (for example, where the time quantizer circuit 30B of FIG. 5 is used) each measurement generates two numbers. To estimate $T_{\Delta(C)}$ and $T_{\Delta(F)}$ system 20 may perform a number $M_{cal}$ of measurements of known time intervals. In a preferred embodiment of the invention, the $i^{th}$ measurement set includes the following three measurements:

1. $T_{d(i,1)}=T_{ref}$ and, $\tau_{fine}=\tau_{fine1}$. Therefore:

$$N_{c(i,1)}T_{\Delta(c)}+N_{f(i,1)}T_{\Delta(f)}=T_{d(i,1)}+T_C+T_{Q(i,1)}+T_{R(i,1)} \tag{21}$$

2. $T_{d(i,2)}=2T_{ref}$ and $\tau_{fine}=\tau_{fine1}$. Therefore:

$$N_{c(i,2)}T_{\Delta(c)}+N_{f(i,2)}T_{\Delta(f)}=T_{d(i,2)}+T_C+T_{Q(i,2)}+T_{R(i,2)} \tag{22}$$

3. $T_{d(i,3)}=4T_{ref}$ and $\tau_{fine}=\tau_{fine2}$. Therefore:

$$N_{c(i,3)}T_{\Delta(c)}+N_{fi,3)}T_{\Delta(f)}=T_{d(i,3)}+T_C+T_{Q(i,3)}+T_{R(i,3)} \tag{23}$$

Each of these measurements is made M times and the resulting three sets of M equations are averaged over i=1, . . . , M to yield the following equations:

$$\overline{N_{c(i,1)}}T_{\Delta(c)}+\overline{N_{f(i,1)}}T_{\Delta(f)}=\overline{T_{d(i,1)}}+T_C+\overline{T_{Q(i,1)}}+\overline{T_{R(i,1)}} \tag{25}$$

$$\overline{N_{c(i,2)}}T_{\Delta(c)}+\overline{N_{f(i,2)}}T_{\Delta(f)}=\overline{T_{d(i,2)}}+T_C+\overline{T_{Q(i,2)}}+\overline{T_{R(i,2)}} \tag{26}$$

$$\overline{N_{c(i,3)}}T_{\Delta(c)}+\overline{N_{f(i,3)}}T_{\Delta(f)}=\overline{T_{d(i,3)}}+T_C+\overline{T_{Q(i,3)}}+\overline{T_{R(i,3)}} \tag{27}$$

For sufficiently large values of M, $T_{R(j)}$ and $T_{Q(j)}$ average to negligible values. Choosing $T_{d(i,1)}=T_{ref}$, $T_{d(i,2)}=2T_{ref}$, and $T_{d(i,3)}=4T_{ref}$ is desirable because it simplifies circuit design. Assuming that noise factors are negligible, subtracting equation (26) from (25) and equation (27) from (26) yields the following system of equations:

$$N_{c((21)}T_{\Delta(c)}+N_{f(21)}T_{\Delta(f)}=T_{ref} \tag{29}$$

and, $$N_{c(31)}T_{\Delta(c)}+N_{f(31)}T_{\Delta(f)}=2T_{ref} \tag{30}$$

where:

$$N_{c(21)}=\overline{N_{c(2)}}-\overline{N_{c(1)}}N_{f(21)}=\overline{N_{f(2)}}-\overline{N_{f(1)}}$$

$$N_{c(31)}=\overline{N_{c(3)}}-\overline{N_{c(1)}}N_{f(31)}=\overline{N_{f(3)}}-\overline{N_{f(1)}} \tag{31}$$

Solving this system of equations provides accurate estimates for $T_{\Delta(F)}$ and $T_{\Delta(C)}$. It is important to note that $T_{d(i,3)}$ is measured while $\tau_{fine}=\tau_{fine2}$ because this assures that the determinant of equations (29) and (30) is large enough to preserve the estimation accuracy.

System 22 can be used to make various types of measurement. One jitter characteristic that can be measured is RMS jitter. RMS jitter can be defined as follows:

$$J_{RMS}=\sqrt{\frac{1}{M}\sum_{i=1}^{M}(T_{d(i)}-\overline{T}_d)^2} \tag{32}$$

where M is the number of samples taken and $T_{d(i)}$ is the time interval measured for the i-th jitter sample.

Estimating $J_{RMS}$ is often sufficient for jitter testing. It can be shown that an estimate of $J_{RMS}$ is given by:

$$\hat{J}^2_{RMS} = T^2_{RMS} + \frac{T^2_{\Delta F}}{12} + \sigma^2_R \tag{33}$$

where $\sigma^2_R$ is the total RMS internal jitter of TDC 30. $T_{\Delta F}$ is known through calibration. If TDC 30 is well characterized then $\sigma^2_R$ will also be known. Therefore, an accurate estimate of RMS jitter can be obtained.

The error in this estimate can be shown to be inversely proportional to M. Therefore, this error can be made to be very small by using a large value for M. M may be, for example, in excess of 500 and is preferably in the range of 1000 to 100,000. In designing a TDC 30 for use in estimating RMS jitter it is more important to minimize $\sigma^2_R$ than it is to minimize $T_{\Delta F}$ because the value of $T_{\Delta F}$ can be determined accurately during calibration of TDC 30.

The variance in internal jitter of time quantizer 30 increases with the number of cycles it takes to complete a measurement. The internal jitter in time quantizer 30 can be estimated by performing two sets of measurements after calibration using a double resolution time quantizer. A first set of measurements is taken with $\tau_{fine}=\tau_{fine1}$. The result is a set of pairs of counts $N_{c1}$, and $N_{f1}$. The second set of measurements is taken with $\tau_{fine}=\tau_{fine2}$, The result is a set of pairs of counts $N_{c2}$, and $N_{f2}$. The second set of counts has the same single shot accuracy as the first set of counts. However, each measurement in the second set takes more cycles of clkA to complete because $\tau_{fine2}<\tau_{fine1}$. In the second set of measurements, a larger proportion of each measurement is carried out in the fine resolution mode.

Since the second set of measurements take longer to complete, the total measured RMS jitter in the second set of measurements is greater than the RMS jitter in the first set of measurements. Since the input signal is the same, the internal jitter of time quantizer 30 can be determined. If we assume that the internal jitter of time quantizer 30 appears as white noise then the internal jitter in the second set of measurements is expected to scale with a factor $\alpha$ relative to the internal jitter in the second set of measurements with $\alpha$ given by:

$$\alpha = \frac{\overline{N_2}}{\overline{N_1}} \tag{34}$$

where $N_1=N_{c1}+N_{f1}$ and $N_2=N_{c2}+N_{f2}$. The bars over $N_2$ and $N_1$ in equation (33) indicate averaging over the number of samples in each set. If the noise is Gaussian it is possible to achieve measurement accuracy of 0.1 ps using this technique by choosing a large M. For example, RMS jitter in a 10 GHz signal could be measured with 0.1 ps accuracy by taking approximately M=300,000 samples.

Figure 22:
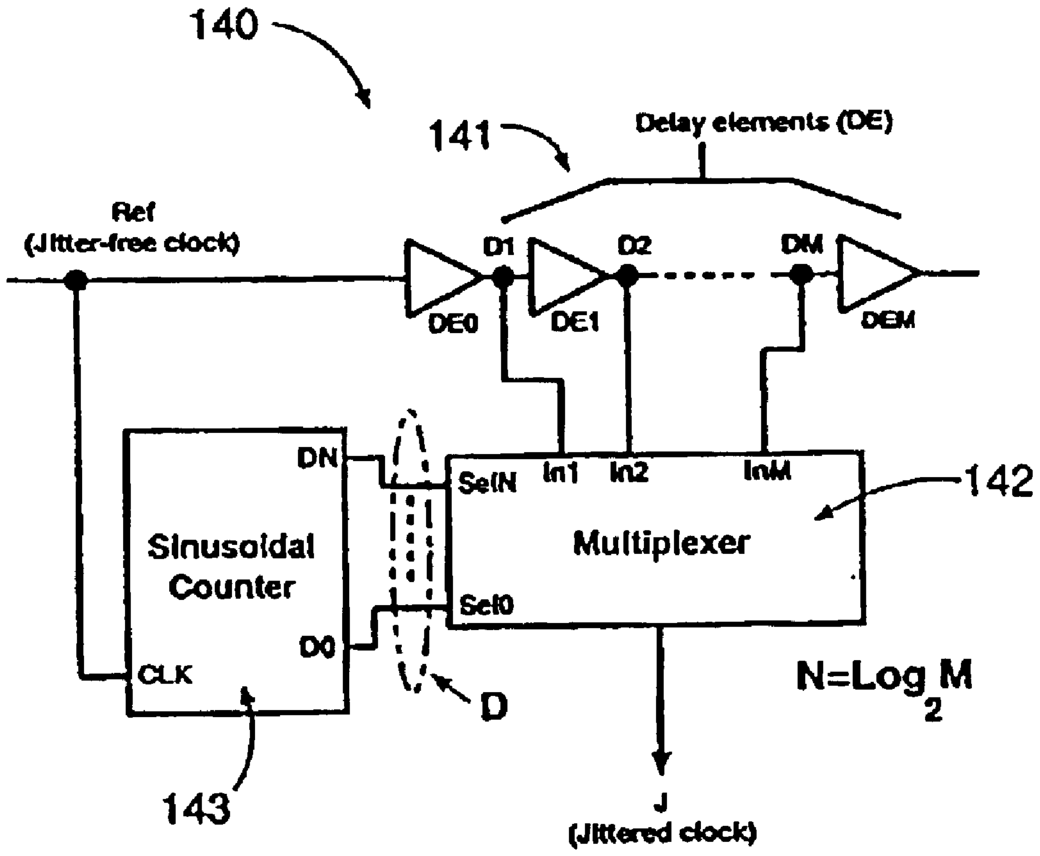
FIG. 22 is a schematic view of a jitter generator circuit.

For testing jitter tolerance and jitter transfer characteristics of devices such as clock recovery units ("CRUs") it is necessary to supply the CRU with a signal that has a known jitter. FIG. 22 shows a circuit 140 which may be used to generate a signal having known jitter characteristics. A jitter-free clock signal is supplied to circuit 140. Circuit 140 includes a delay line 141, a multiplexer 142 and a sequence counter 143. The multiplexer connects a selected tap of delay line 141 to output J in response to a control signal from sequence counter 143. Sequence counter 143 specifies which tap is connected to output J at any clock edge. For example, if delay line 141 has 8 taps and sequence counter 143 is a three bit up/down counter then circuit 140 will generate a triangular shaped jitter signal with a maximum peak-to-peak amplitude of $\tau_g$ where $\tau_g$ is the delay introduced by each delay element of delay line 141. By using a counter with a sequence which follows a sinusoidal pattern, circuit 140 will generate a signal having jitter which varies sinusoidally with time. Sequence counter 143 may be programmable so that circuit 140 can generate various types of jitter signal at its output J.

Figure 23:
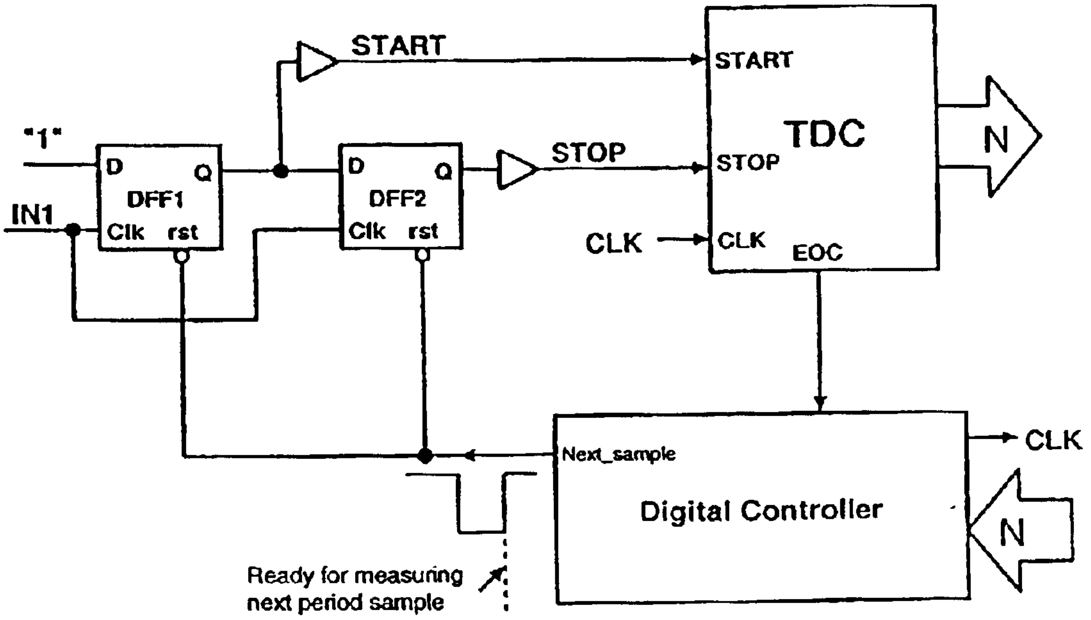
FIG. 23 is a schematic view of a configuration of edge sampler suitable for cycle-to-cycle jitter measurement.

A TDC 22 may be used on-chip to measure period jitter. TDC 22 can measure period jitter by causing edge sampler 24 to make a number of measurements. In each measurement, the edge sample passes two consecutive rising (or falling) edges of a signal $V_{in}$ being measured to time quantizer 30 as START and STOP signals. After this has been done, control circuit 26 reads the value(s) of N stored in the counter(s) of time quantizer 30, passes these values to an analysis system and commences another measurement. This can be repeated until a desired number of samples has been taken. FIG. 23 shows an edge sampler circuit that may be used in making period jitter measurements.

The analysis system will typically be an external tester but may also be on chip. Where the analysis system is external then the data collected is transmitted to the analysis system through a suitable interface. For example, the chip may comprise a serial bus such as a JTAG interface (as specified currently by the IEEE 1145.1 specification) or a parallel interface for moving the data off-chip. Preferably an on-chip data storage area is provided to hold the collected data while it is waiting to be delivered to the analysis system.

The analysis system can form a histogram of the data and calculate variance and peak-to-peak jitter, or use the variance formula of equation (31) to compute RMS jitter. If the analysis system receives information about the time at which each sample was taken then it can also analyze frequency components of the jitter. Thus, appropriately configured systems according to the invention may be used to conduct full jitter compliance tests.

Figure 24A:
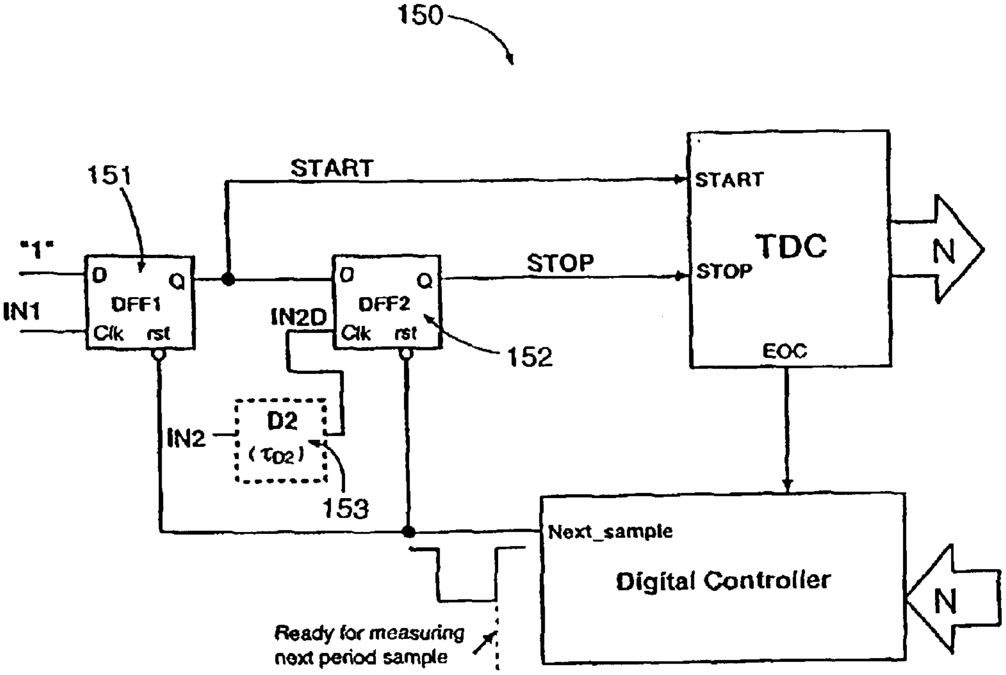
FIG. 24A is a schematic view of a configuration of edge sampler suitable for relative jitter measurement; and, FIG. 24B is a timing diagram illustrating significant signals in the circuit of FIG. 24A.

In some applications, such as serial communications it is necessary to measure jitter between corresponding edges of two different signals. For example, without loss of generality corresponding edges of two signals might be required to fall within a tight time window. FIG. 24A shows an edge sampler circuit 150 that can be used to generate START and STOP signals for measuring jitter between two signals IN1 and IN2. In circuit 150, flip flop 151 samples an edge of IN1 and flip flop 152 samples an edge of IN2 which is closest to the sampled edge of IN1. A delay element 153 ensures that the output of flip flop 151 has enough time to be set before the edge of IN2 arrives. This will be the case if:

$$t_{IN2}>t_{IN1}-\tau_{D2}+\tau_{q1}+\tau_{s2} \tag{35}$$

where $\tau_{q1}$ is the CLK-to-Q delay of flip flop 151, $\tau_{s2}$ is the setup time of flip flop 152, and $\tau_{D2}$ is the delay introduced by delay element 153.

Figure 24B:
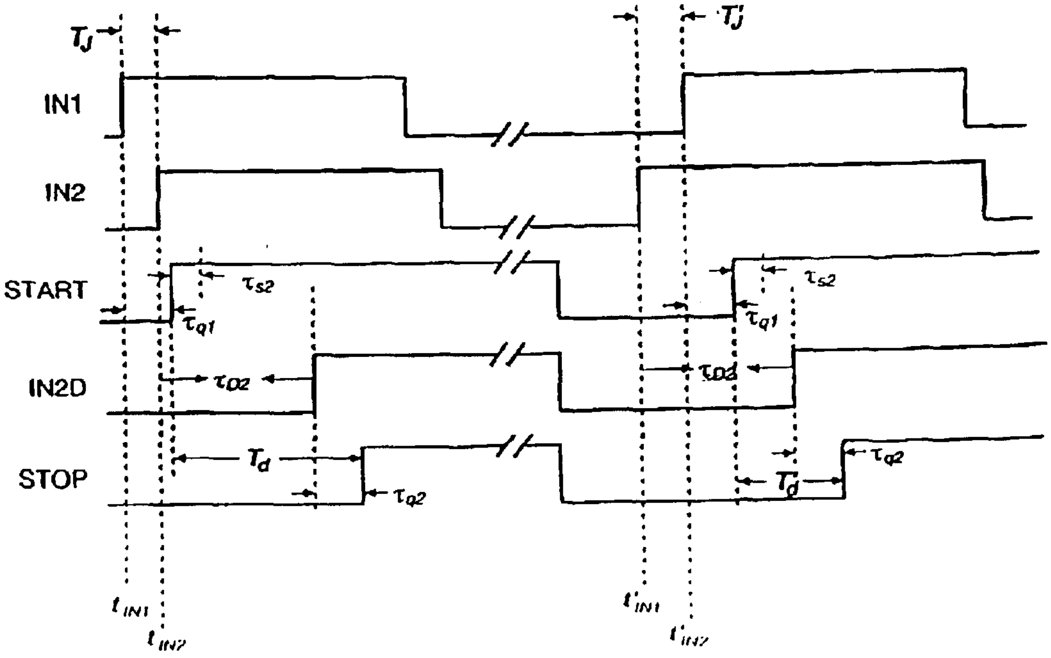

FIG. 24B is a timing diagram which shows waveforms at various points in edge sampler circuit 150 for one positive and one negative value of $T_j=t_{IN1}-t_{IN2}$. The generated START and STOP signals are passed to TDC 22 for measurement of the time displacement between them. After a measurement is completed, flip flops 151 and 152 are reset and another measurement can be taken. While the sample and hold times of flip flops 151 and 152 affect the measured time displacements, these times are constant and affect all measurements equally. They can therefore be dealt with by calibration. Further, it is typically the fluctuation in measured values between measurements that is of interest. These fluctuations are not affected by constant offsets.

Relative jitter tests can be used to perform jitter tolerance limit tests of CRUs. This can be done by applying a signal with a known jitter to the CRU and then measuring the relative jitter between this input signal and a signal output from the CRU.

For production tests of CRUs it is desirable to test jitter tolerance at at least two frequencies, one frequency within the loop bandwidth of the CRU and another frequency outside the loop bandwidth of the CRU.

In the foregoing disclosure, conventional elements, such as power supply connections and the like are not specifically discussed or illustrated in the drawings. Such elements are well known to those skilled in the art and have been omitted for clarity.

Those skilled in the art will appreciate that the circuits and methods described herein have various advantages. Among these are that the invention may be practised with circuits which are entirely digital and are well adapted to being designed using conventional design tools including automatic place and route. Jitter measurements having an accuracy in the order of 10 ps can be attained. The digital and compact nature of this TDC circuit makes it very attractive for BIST applications for testing high-speed serial communication interfaces, e.g., clock and data recovery, timing circuits, and edge placement circuits. Since the TDC provides a very high-resolution time measurement capability, it is also suitable for use in testing digital clock recovery and clock synthesis circuits. It is also notable that oscillators 40A and 40B integrate power supply noise (which is non-random). High frequency power supply noise is effectively cancelled. If oscillators 40A and 40B are made structurally very similar to one another they will be affected in substantially the same manner by any low frequency power supply noise. Therefore, low frequency power supply noise can be effectively cancelled as well.

Where a component (e.g. a circuit, device, assembly, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. For example, it will be understood from the foregoing that in systems according to various embodiments of the invention:

time delay elements may be inserted in places where their effects can be compensated for in hardware or software;

logic levels may be reversed and hardware modifications made to preserve the function of the circuits in question;

the invention may be applied to measure various of the parameters referred to above including T.

Accordingly, the scope of the invention is to be construed in accordance with the substance defined by the following claims.

What is claimed is:

1. A time to digital converter comprising:

a timing circuit comprising first and second digital oscillators producing first and second clock signals respectively, the first and second oscillators having different periods;

at least one of the oscillators comprising a plurality of controllable delay elements, the delay elements, when activated, altering the period of the oscillator;

a coincidence detector connected to generate a coincidence signal when a reference point in the first clock signal has a known time relationship to a corresponding reference point on the second clock signal;

a first counter connected to count a number, N, of cycles of the first oscillator until the coincidence detector generates the coincidence signal; and, a resolution adjustment circuit connected to start the first and second oscillators at times separated by a known interval, compare the number N to a threshold and, if N is not at least equal to a threshold value altering the period of at least one of the oscillators by activating or deactivating one or more of the controllable delay elements.

2. The time to digital converter of claim 1 wherein the timing circuit has a plurality of states including a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$; and, the time to digital converter comprises:

a resolution switching control circuit configured to switch the timing circuit between its states; and, a second counter connected to count a number ($N_C$) of edges of the first signal between a START signal and a time when the timing circuit is switched away from its first state;

wherein the first counter is connected to count a number ($N_F$) of edges of the first signal between a time when the timing circuit is switched to its second state and the time when the coincidence signal is generated.

3. The time to digital converter of claim 2 wherein the resolution switching control circuit comprises a delay element connected to provide a delayed first clock signal and a coincidence detector connected to generate a coincidence signal when a reference point in the second clock signal has a known time relationship to a corresponding reference point on the delayed first clock signal.

4. The time to digital converter of claim 3 wherein the delay element of the resolution switching control circuit is selectively configurable to provide one of at least two different delays.

5. The time to digital converter of claim 3 wherein the delay element comprises a multiplexer connected to a plurality of signal path segments, at least one of the second signal path segments comprising at least one gate, the delayed first clock signal passing through one of the signal path segments selected by the multiplexer.

6. The time to digital converter of claim 3 comprising a range extender circuit, the range extender circuit suppressing the coincidence signal until corresponding edges of the first and second clock signals are within one period of the second clock signal relative to one another.

7. The time to digital converter of claim 6 wherein the range extender circuit is configured to suppress the coincidence signal until no other edges of the first and second clock signals lie between the corresponding edges of the first and second clock signals.

8. The time to digital converter of claim 3 comprising a range extender circuit, the range extender circuit suppressing the coincidence signal until corresponding edges of the first and second clock signals are within one half period of the second clock signal relative to one another.

9. The time to digital converter of claim 8 wherein the delay element is selectively configurable to provide one of at least two different delays.

10. The time to digital converter of claim 8 wherein the delay element comprises a multiplexer connected to a plurality of signal path segments, at least one of the second signal path segments comprising at least one gate, the delayed first clock signal passing through one of the signal path segments selected by the multiplexer.

11. The time to digital converter of claim 3 wherein each of the oscillators comprises a plurality of controllable delay elements.

12. The time to digital converter of claim 11 wherein, in each of the oscillators, the plurality of controllable delay elements comprises a series of digitally controllable delay elements wherein an $I^{th}$ one of the delay elements provides a delay which is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a real number with $1<(1+\xi)<2$ and I is an index which identifies the delay elements in the series.

13. The time to digital converter of claim 2 comprising a range extender circuit, the range extender circuit suppressing the coincidence signal until corresponding edges of the first and second clock signals are within one cycle of the second clock relative to one another.

14. The time to digital converter of claim 13 wherein the range extender circuit comprises a first counter connected to count edges of the first signal, a second counter connected to count edges of the second signal and a comparator connected to compare outputs of the first and second counters and the range extender circuit generates a valid range signal when a pulse at the comparator output exceeds a predetermined width.

15. The time to digital converter of claim 14 wherein the first and second counters each comprise a binary counter.

16. The time to digital converter of claim 14 wherein the predetermined width is determined by a delay element coupled between an output of the comparator and a flip flop.

17. The time to digital converter of claim 14 wherein the predetermined width is determined by a delay element coupled between the first clock signal and an input to the first binary counter.

18. The time to digital converter of claim 2 wherein the first and second oscillators comprise ring oscillators each comprising a closed signal path defined at least in part by a plurality of series-connected delay elements each having an input and an output.

19. The time to digital converter of claim 18 wherein the controllable delay elements each comprise a logic gate having an input and output connected in the signal path and a variable load element connected to the output.

20. The time to digital converter of claim 19 wherein the variable load element comprises a tri-state device having an input connected to the output of the logic gate.

21. The time to digital converter of claim 18 wherein each of the oscillators comprises a plurality of digitally controllable delay elements.

22. The time to digital converter of claim 21 wherein, in each of the oscillators, the plurality of digitally controllable delay elements comprises a series of digitally controllable delay elements wherein an $I^{th}$ one of the delay elements provides a delay which is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a number with $1<(1+\xi)<2$ and I is an index which identifies the delay elements in the series.

23. The time to digital converter of claim 2 wherein each of the oscillators comprises a plurality of digitally controllable delay elements.

24. The time to digital converter of claim 23 wherein, in each of the oscillators, the plurality of digitally controllable delay elements comprises a series of digitally controllable delay elements wherein an $I^{th}$ one of the delay elements provides a delay which is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a number with $1<(1+\xi)<2$ and I is an index which identifies the delay elements in the series.

25. The time to digital converter of claim 1 comprising a range extender circuit, the range extender circuit suppressing the coincidence signal until corresponding edges of the first and second clock signals are within one period of the second clock signal relative to one another.

26. The time to digital converter of claim 24 wherein the range extender circuit comprises a first counter connected to count edges of the first signal, a second counter connected to count edges of the second signal and a comparator connected to compare outputs of the first and second counters.

27. The time to digital converter of claim 25 wherein the range extender circuit comprises first and second memory elements connected to receive a signal from the comparator, and one or more delay elements connected to delay the application of the signal from the comparator to the second memory element relative to the application of the signal from the comparator to the first memory element.

28. The time to digital converter of claim 1 comprising a range extender circuit, the range extender circuit suppressing the coincidence signal until corresponding edges of the first and second clock signals are within one half period of the second clock signal relative to one another.

29. The time to digital converter of claim 6 wherein the range extender circuit comprises a first binary counter connected to count edges of the first signal, a second binary counter connected to count edges of the second signal and a comparator connected to compare outputs of the first and second binary counters and the range extender circuit generates a range valid signal when a pulse at the comparator output exceeds a predetermined width.

30. The time to digital converter of claim 29 wherein the predetermined width is determined by a delay element coupled between an output of the comparator and a flip flop.

31. The time to digital converter of claim 29 wherein the predetermined width is determined by a delay element coupled between the first clock signal and an input to the first binary counter.

32. The time to digital converter of claim 6 wherein each of the oscillators comprises a plurality of digitally controllable delay elements.

33. The time to digital converter of claim 32 wherein, in each of the oscillators, the plurality of digitally controllable delay elements comprises a series of digitally controllable delay elements wherein an $I^{th}$ one of the delay elements provides a delay which is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a number with $1<(1+\xi)<2$ and I is an index which identifies the delay elements in the series.

34. The time to digital converter of claim 1 wherein the first and second oscillators comprise ring oscillators each comprising a closed signal path defined at least in part by a plurality of series-connected delay elements each having an input and an output.

35. The time to digital converter of claim 34 wherein the controllable delay elements each comprise a gate having an input and output connected in the signal path and a variable load element connected to the output.

36. The time to digital converter of claim 35 wherein the variable load element comprises a tri-state device having an input connected to the output of the gate.

37. The time to digital converter of claim 36 wherein the tri-state device comprises a tri-NOT gate.

38. The time to digital converter of claim 34 wherein the load element comprises a capacitor connected in series between the output of the gate and a digital switch.

39. The time to digital converter of claim 38 wherein the capacitor comprises an NMOS gate capacitor having a gate electrode connected to the output of the gate.

40. The time to digital converter of claim 38 wherein each of the plurality of controllable delay elements, when activated, affect a period of a corresponding oscillator and wherein activation of each of the plurality of controllable delay elements provides substantially the same effect on the period of the corresponding oscillator.

41. The time to digital converter of claim 38 wherein, in each of the oscillators, the plurality of controllable delay elements comprises a series of digitally controllable delay elements wherein an $I^{th}$ one of the delay elements provides a delay which is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a number with $1<(1+t)<2$ and I is an index which identifies the delay elements in the series.

42. The time to digital converter of claim 1 wherein each of the oscillators comprises a plurality of digitally controllable delay elements.

43. The time to digital converter of claim 42 comprising a state machine having outputs connected to control each of the plurality of digitally controllable delay elements.

44. A time to digital converter comprising:

a timing circuit comprising first and second digital oscillators producing first and second clock signals respectively, the timing circuit switchable between a plurality of states including a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$;

a resolution switching control circuit connected to switch the timing circuit between its states when a reference point of the first clock signal approaches a first predetermined time relationship with a corresponding reference point of the second clock signal;

a coincidence detector connected to generate a coincidence signal when the reference point in the first clock signal has a second predetermined time relationship to the corresponding reference point on the second clock signal;

a first counter connected to count a number ($N_F$) of edges of the first clock signal between a time when the timing circuit is switched into its second state and the time when the coincidence signal is generated; and, a second counter connected to count a number ($N_C$) of edges of the first signal between a START signal and a time when the timing circuit is switched out of its first state.

45. The time to digital converter of claim 44 wherein the resolution switching control circuit comprises a delay element connected to provide a delayed first clock signal and a coincidence detector connected to generate a resolution switching control signal when the reference point in the second clock signal has a predetermined time relationship to a corresponding reference point on the delayed first clock signal.

46. The time to digital converter of claim 45 wherein the delay element has a first state resulting in a first delay of the delayed first clock signal and a second state resulting in a second delay of the delayed first clock signal different from the first delay.

47. The time to digital converter of claim 46 comprising a range extender circuit, the range extender circuit suppressing the coincidence signal until corresponding reference points of the first and second clock signals are within one period of the second clock signal relative to one another.

48. The time to digital converter of claim 47 wherein the reference points are corresponding signal edges and the range extender circuit is configured to suppress the coincidence signal until no other edges of the first and second clock signals lie between the corresponding edges of the first and second clock signals.

49. The time to digital converter of claim 47 wherein:

the range extender circuit comprises a first counter connected to count reference points of the first signal, a second counter connected to count reference points of the second signal and a comparator connected to compare outputs of the first and second counters; and, the range extender circuit generates a range valid signal when a pulse at an output of the comparator exceeds a predetermined width.

50. The time to digital converter of claim 49 wherein the first and second counters each comprise a binary counter.

51. The time to digital converter of claim 49 wherein the predetermined width is determined by a delay element coupled between the output of the comparator and a flip flop.

52. The time to digital converter of claim 49 wherein the predetermined width is determined by a delay element coupled between the first clock signal and an input to the first counter.

53. The time to digital converter of claim 46 comprising a range extender circuit, the range extender circuit suppressing the coincidence signal until corresponding reference points of the first and second clock signals are within one half of one period of the second clock signal relative to one another.

54. The time to digital converter of claim 53 wherein the corresponding reference points comprise corresponding signal edges and the range extender circuit is configured to suppress the coincidence signal until no other edges of the first and second clock signals lie between the corresponding edges of the first and second clock signals.

55. The time to digital converter of claim 53 wherein:

the range extender circuit comprises a first counter connected to count reference points of the first signal, a second counter connected to count reference points of the second signal and a comparator connected to compare outputs of the first and second counters; and, the range extender circuit generates a range valid signal when a pulse at an output of the comparator exceeds a predetermined width.

56. The time to digital converter of claim 55 wherein the first and second counters each comprise a binary counter.

57. The time to digital converter of claim 55 wherein the predetermined width is determined by a delay element coupled between the output of the comparator and a flip flop.

58. The time to digital converter of claim 55 wherein the predetermined width is determined by a delay element coupled between the first clock signal and an input to the first counter.

59. The time to digital converter of claim 44 comprising an edge sampler wherein the START signal is generated by the edge sampler.

60. The time to digital controller of claim 44 comprising an edge sampler, the edge sampler generating the START signal and a STOP signal, the START signal connected to start the first oscillator and the stop signal connected to start the second oscillator.

61. The time to digital converter of claim 60 wherein the edge sampler is configured to generate the START signal upon a first edge of a test signal and to generate the STOP signal upon a second, subsequent, edge of the test signal.

62. The time to digital converter of claim 61 wherein the edge sample is configured to generate the START and STOP signals in a plurality of subsequent periods of the test signal.

63. The time to digital converter of claim 44 wherein at least one of the first and second oscillators comprises a plurality of digitally controllable delay elements.

64. The time to digital converter of claim 63 wherein, in each of the oscillators, the plurality of digitally controllable delay elements comprises a series of digitally controllable delay elements and a delay provided by an $I^{th}$ one of the delay elements is controllably variable by an amount $\tau_{CDE(I)}$ where $\tau_{CDE(I)}$ for the delay elements in the series of digitally controllable delay elements are related to one another by $\tau_{CDE(I)}=(1+\xi)\tau_{CDE(I-1)}$ where $\xi$ is a number with $1<(1+\xi)<2$ and I is an index which identifies the delay elements in the series.

65. The time to digital converter of claim 63 wherein, in the at least one of the oscillators, the plurality of digitally controllable delay elements comprises a series of digitally controllable delay elements which provide delays $\tau_{CDE}$ which are substantially equal to one another.

66. The time to digital converter of claim 63 comprising a state machine having outputs connected to control each of the plurality of digitally controllable delay elements.

67. The time to digital converter of claim 63 wherein the first and second oscillators comprise ring oscillators.

68. The time to digital converter of claim 63 wherein the controllable delay elements each comprise a gate having an input and output connected in a signal path and a variable load element connected to the output.

69. The time to digital converter of claim 68 wherein the variable load element comprises a tri-state device having an input connected to the output of the gate.

70. The time to digital converter of claim 69 wherein the tri-state device comprises a tri-NOT gate.

71. The time to digital converter of claim 68 wherein the load element comprises a capacitor connected in series between the output of the gate and a digital switch.

72. The time to digital converter of claim 71 wherein the capacitor comprises an NMOS gate capacitor having a gate electrode connected to the output of the gate.

73. The time to digital converter of claim 44 comprising an edge sampler connected to trigger the first and second oscillators upon detecting first and second reference points in a signal output from a circuit under test.

74. The time to digital converter of claim 73 wherein the circuit under test comprises a PLL.

75. The time to digital converter of claim 73 wherein the time to digital converter and the circuit under test are both on an integrated circuit and the time to digital converter comprises a data output for conveying off-chip timing data relating to the signal output from the circuit under test.

76. The time to digital converter of claim 75 wherein the data output comprises a serial data output.

77. A time to digital converter comprising:

means for generating first and second clock signals respectively having first and second periods;

means for varying at least one of the first and second periods to reduce a difference between the first and second periods from a first value $T_{\Delta 1}$ to a second value $T_{\Delta 2}$ where $T_{\Delta 2}<T_{\Delta 1}$;

means for operating the means for varying the at least one of the first and second periods when a reference point in the first clock signal has a known time relationship to a corresponding reference point on the second clock signal; and, means for counting features of the first clock signal.

78. The time to digital converter of claim 77 wherein the means for counting features of the first clock signal comprises means for counting the features of the first clock signal while the difference between the first and second periods has the first value $T_{\Delta 1}$.

79. The time to digital converter of claim 78 wherein the means for counting features of the first clock signal comprises means for counting the features of the first clock signal while the difference between the first and second periods has the second value $T_{\Delta 2}$.

80. The time to digital converter of claim 77 comprising means for estimating a difference in periods of the first and second clock signals.

81. The time to digital converter of claim 77 comprising means for adjusting a difference in periods of the first and second clock signals to have a value within a desired range.

82. The time to digital converter of claim 77 comprising means for suppressing operation of the means for varying at least one of the first and second periods until the first and second clock signals are within one period of the second clock signal relative to one another.

83. The time to digital converter of claim 77 comprising means for controlling the time to digital converter to repeatedly measure a period of a test signal.

84. The time to digital converter of claim 77 comprising means for switching the known time relationship between at least two values.

85. The time to digital converter of claim 77 comprising means for determining an internal jitter of the time to digital converter.

86. The time to digital converter of claim 77 comprising means for obtaining a corrected jitter measurement for a test signal based upon an internal jitter determined by the means for determining an internal jitter of the time to digital converter.

87. A method for time to digital conversion comprising providing first and second digital oscillators having a first state wherein a difference in periods of the first and second signals is $T_{\Delta 1}$ and a second state wherein a difference in periods of the first and second signals is $T_{\Delta 2}$ where $T_{\Delta 2}<T_{\Delta 1}$;

with the first and second digital oscillators in the first state, starting the first oscillator upon the occurrence of a first control signal and starting the second oscillator on the occurrence of a second control signal a time $T_d$ later;

when reference points of the first and second signals occur within a predetermined time delay of one another switching the oscillators to the second state;

counting a number ($N_C$) of edges of the first clock signal which occur while the oscillators are in the first state;

counting a number ($N_F$) of edges of the first clock signal which occur while the oscillators are in the second state; and, stopping counting the number ($N_F$) when the reference points have a specified time relationship.

88. The method of claim 87 wherein the reference points are edges of the first and second signals and the specified time relationship is coincidence of the edges.

89. The method of claim 87 comprising acquiring a first set of the numbers $N_F$ and $N_C$ for $T_d$ having a known value $T_{ref}$ while the known time delay has a first value and a second set of the numbers $N_F$ and $N_C$ for $T_d$ having a known value $T_{ref}$, a known multiple of $T_{ref}$, or a known fraction of $T_{ref}$, while the known time delay has a second value.

90. The method of claim 89 comprising averaging $N_F$ and $N_C$ for each of the first and second sets of measurements.

91. The method of claim 87 comprising generating the first control signal at the occurrence of a reference point in a test signal and generating the second control signal at the occurrence of a second reference point in the test signal.

92. The method of claim 91 wherein the first and second reference points in the test signal are separated by one period of the test signal.

93. The method of claim 91 wherein the first and second reference points in the test signal are edges of the test signal.

94. The method of claim 91 comprising repeating the method for a plurality of periods of the test signal to obtain a set of numbers $N_C$ and $N_F$ and subsequently deriving timing information relating to the test signal from the set of numbers $N_C$ and $N_F$ for the test signal while the known time delay has the first value.

95. The method of claim 91 comprising acquiring a first set of the numbers $N_F$ and $N_C$ for the test signal while the known time delay has a first value and a second set of the numbers $N_F$ and $N_C$ for the test signal while the known time delay has a second value.

96. The method of claim 95 comprising determining first and second measures of jitter of the test signal from each of the first and second sets of numbers.

97. The method of claim 96 comprising determining an internal jitter of a measurement system comprising the first and second oscillators based upon differences between the first and second measures of jitter.

98. The method of claim 97 wherein the first and second sets of numbers each comprise at least 500 pairs of numbers.

99. The method of claim 97 wherein the first and second sets of numbers each comprise at least 1000 pairs of numbers.

100. The method of claim 97 wherein the first value is larger than the second value and determining the internal jitter of a measurement system includes multiplication or division by a parameter a given by:

$$\alpha = \frac{\overline{N_2}}{\overline{N_1}}$$

where $N_2$ is $N_F+N_C$ for a pair of numbers in the second set of numbers and $N_1$ is $N_F+N_C$ for a pair of numbers in the first set of numbers.

101. The method of claim 97 comprising obtaining a corrected measure of jitter of the test signal by performing one or more operations which include subtracting the internal jitter.

102. The method of claim 94 comprising obtaining a corrected measure of jitter of a test signal by performing one or more operations which include correcting for an internal jitter of a measurement system comprising the first and second oscillators.

103. The method of claim 94 wherein repeating the method for a plurality of cycles of the test signal to obtain a set of numbers $N_C$ and $N_F$ is performed on an integrated circuit chip and deriving a measure of jitter in the test signal from the set of numbers $N_C$ and $N_F$ is performed off-chip.

104. The method of claim 87 comprising suppressing switching the oscillators to the second state until corresponding features of the first and second clock signals are within one period of the second clock signal relative to one another.

105. The method of claim 87 comprising suppressing switching the oscillators to the second state until the first and second clock signals are within one half period of the second clock signal relative to one another.

106. The method of claim 87 comprising adjusting the first and second digital oscillators by:

starting the first and second oscillators at times separated by a known interval;

counting a number of features of at least one of the clock signals until reference points on the first and second clock signals have a known time relationship; and, if the number is not at least equal to a threshold value altering the period of at least one of the oscillators.

107. The method of claim 106 wherein adjusting the first and second oscillators comprises determining whether the first oscillator has a period longer than a period of the second oscillator and, if not, increasing the period of the first oscillator, decreasing the period of the second oscillator, or both increasing a period of the first oscillator and decreasing a period of the second oscillator.

108. The method of claim 106 wherein the first and second oscillators comprise a plurality of control inputs and adjusting the first and second oscillators comprises performing a search of combinations of the control inputs.

109. The method of claim 108 wherein the search is an exhaustive search.

110. The method of claim 106 wherein the first and second oscillators respectively comprise first and second pluralities of control inputs and adjusting the first and second oscillators comprises, if the period of the first oscillator is less than the period of the second oscillator performing a search of combinations of the first plurality of control inputs and, if the period of the second oscillator is less than the period of the first oscillator, performing a search of combinations of the second plurality of control inputs.

111. In apparatus for identifying a coincidence between first and second periodic signals, a range extender circuit comprising a first counter connected to count edges of the first signal, a second counter connected to count edges of the second signal, and a comparator connected to compare outputs of the first and second counters.

112. The range extender circuit of claim 111 comprising a circuit for generating a control signal when a pulse at an output of the comparator exceeds a predetermined width.

113. The range extender circuit of claim 112 wherein the first and second counters each comprise a k-bit counter.

114. The range extender circuit of claim 113 wherein the predetermined width is determined by a delay element coupled between the output of the comparator and a flip flop.

115. The range extender circuit of claim 113 wherein the predetermined width is determined by a delay element coupled between the first clock signal and an input to the first counter.

* * * * *